US012713889B2

(12) United States Patent
Yang et al.

(10) Patent No.: US 12,713,889 B2
(45) Date of Patent: Aug. 18, 2026

(54) SEMICONDUCTOR STRUCTURE WITH ENHANCED VOLTAGE STRESS CONTROL AND METHOD OF FORMING THE SAME

(71) Applicant: TAIWAN SEMICONDUCTOR MANUFACTURING COMPANY LTD., Hsinchu (TW)

(72) Inventors: Chung-Chieh Yang, Hsinchu County (TW); Ming-Yih Wang, Hsin-Chu (TW); Po-Hsien Chen, Taipei City (TW); Yi-Jui Chang, Yunlin County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 754 days.

(21) Appl. No.: 18/169,855

(22) Filed: Feb. 15, 2023

(65) Prior Publication Data

US 2024/0274508 A1 Aug. 15, 2024

(51) Int. Cl.

| | |
|---|---|
| ***G06F 30/30*** | (2020.01) |
| ***H10W 20/00*** | (2026.01) |
| ***H10W 20/20*** | (2026.01) |
| ***H10W 20/41*** | (2026.01) |
| ***H10W 20/42*** | (2026.01) |

(52) U.S. Cl.
CPC ......... *H10W 20/20* (2026.01); *H10W 20/023* (2026.01); *H10W 20/42* (2026.01); *H10W 20/435* (2026.01)

(58) Field of Classification Search
CPC ... H10W 20/20; H10W 20/023; H10W 20/42; H10W 20/435; H10D 89/10
See application file for complete search history.

(56) References Cited

U.S. PATENT DOCUMENTS 9,459,599 B2 * 10/2016 Allen-Ware .......... G06F 11/008

* cited by examiner

*Primary Examiner* — Jack Chiang
*Assistant Examiner* — Brandon Bowers
(74) *Attorney, Agent, or Firm* — WPAT LAW; Anthony King

(57) ABSTRACT

A method includes: accessing a first cell, where the first cell includes: a first active region and a second active; gate electrodes arranged in a second layer over the first layer; first conductive lines extending in the second layer; second conductive lines extending in the second layer; a third and a fourth conductive lines extending in a third layer over the second layer; and first gate vias arranged in a fourth layer and electrically coupled to the gate electrodes. The method also includes: determining a performance metric and a dielectric voltage stress level; and in response to the performance metric or the dielectric voltage stress level failing to fulfilling a specification, revising the first cell to generate a second cell by moving at least one of the first gate vias to be electrically coupled to the fourth conductive line.

20 Claims, 18 Drawing Sheets

SEMICONDUCTOR STRUCTURE WITH ENHANCED VOLTAGE STRESS CONTROL AND METHOD OF FORMING THE SAME

BACKGROUND

Electronic equipment involving semiconductor devices are essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

As technologies evolve, designs for devices become more complicated in consideration of smaller dimensions and an increase of functionality and the amount of circuitries. Numerous manufacturing operations are implemented within such a small and high performance semiconductor device. The manufacturing of a semiconductor device becomes more complicated in a miniaturized scale, and the increase in complexity of manufacturing may cause deficiencies such as insufficient reliability and lifetime for some applications, such as the fields of medical, space, automobile, and the like. Therefore, there is a continuous need to modify the structure and manufacturing method of the devices in the electronic equipment in order to improve device reliability while maintaining device performance.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
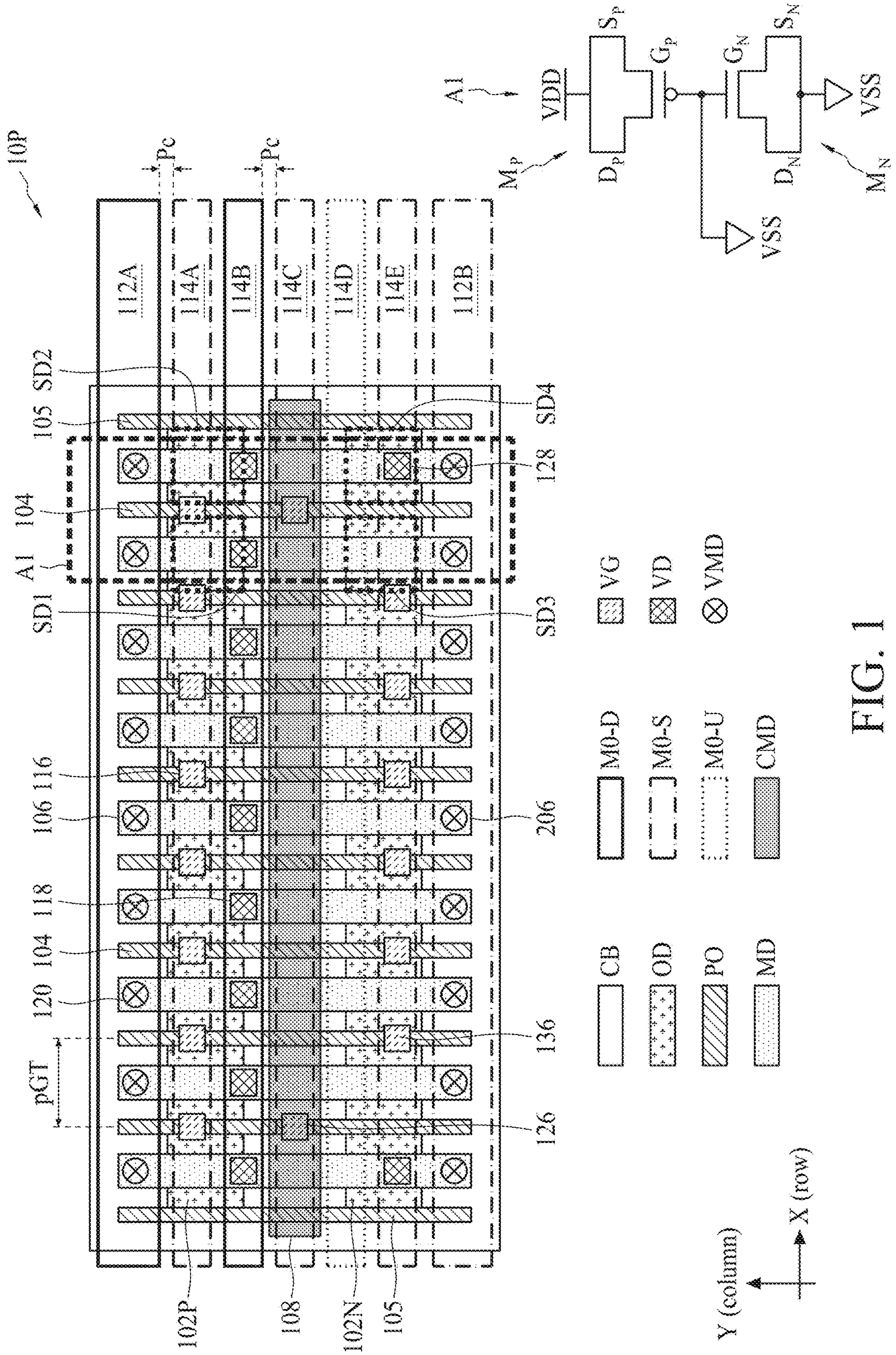
FIG. 1 shows a schematic block diagram and an example electronic circuit of a cell, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “upper,” “on,” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as “first,” “second” and “third” describe various elements, components, regions, layers and/or sections, these elements, components, regions, layers and/or sections should not be limited by these terms. These terms may be only used to distinguish one element, component, region, layer or section from another. The terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms “about,” “substantial” or “substantially” generally mean within 10%, 5%, 1% or 0.5% of a given value or range. Alternatively, the terms “about,” “substantial” or “substantially” mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or simply "cell" used throughout the present disclosure refers to a group of circuit patterns in a design layout to implement specific functionalities of a circuit. A cell is generally comprised of one or more layers, and each layer includes various patterns expressed as polygons of the same or various shapes. A design layout may be generated by placement of one or more cells in allocated locations of a blank layout. In some cases, through the placement step, the placed cells are electrically connected using an interconnect structure. The geometries of the patterns in the cells may be adjusted at different stages of a design flow in order to compensate for design and process effects. The cells may be accessible from cell libraries provided by semiconductor manufacturers or designers. In some cases, the cell library may be stored in a non-transitory computer-readable storage medium and accessed by a processor in various circuit design stages.

Throughout the present disclosure, the cells are designed for implementing electronic circuits formed by semiconductor devices, e.g., a metal-oxide-semiconductor (MOS) field-effect transistor (FET) device, and can be a planar FET device, a fin-type FET (FinFET) device, a gate-all-around (GAA) device, a nanosheet device, a nanowire device, a fully-depleted silicon-on-isolator (FDSOI) device, or the like.

Embodiments of the present disclosure discuss a new standard cell with enhanced reliability for the voltage stress-induced dielectric breakdown. As the semiconductor device is required to be manufactured with a continuous reduction in device size along with increased functionality and better performance, the device elements are formed with a less dimension of length, width, thickness or spacing. In some examples, when the thickness or length of a dielectric layer, which is configured as an electric insulating member in a semiconductor device, is made less than before, its normal breakdown voltage may become lower or the lifetime of the dielectric layer may decrease. As a result, the effect of so-called "time-dependent dielectric breakdown" may be worsened, and the reliability of the semiconductor device is not satisfactory. The impact of the dielectric breakdown on the device reliability is more pronounced when the semiconductor device is applied in the fields such as the medical industry, the space industry, the high-performance processor industry, the automotive industry, and the like.

The present disclosure proposes various standard cells and a standard cell design procedure to improve the reliability of a fabricated circuit through seeking a better balance between the device performance and the dielectric voltage stress experienced by the circuit. By help of rearranging the locations of the conductive elements in the cell, such as the gate via or drain via in a transistor or a capacitor of the circuit, in different locations of the cell, or removing at least some of the gate vias or drain vias, the resulting risk of dielectric breakdown imposed on the adjacent dielectric layers can be reduced significantly at the price of minor loss of decoupling capacitance of the transistor or the capacitor. The lifetime of the semiconductor device can thus be prolonged without increasing the manufacturing cost or complexity. The semiconductor device can provide better functions in a more economical way accordingly.

FIG. 1 shows a schematic block diagram and an example electronic circuit of a standard cell 10P or simply a cell, in accordance with some embodiments of the present disclosure. In some embodiments, the cell 10P shown in the left-side subfigure of FIG. 1 includes one or more electronic circuits formed by semiconductor devices, e.g., a metal-oxide-semiconductor (MOS) field-effect transistor (FET) device, and can be a planar FET device, a fin-type FET (FinFET) device, a gate-all-around (GAA) device, a nanosheet device, a nanowire device, a fully-depleted silicon-on-isolator (FDSOI) device, or the like. In the depicted example shown in FIG. 1, the cell 10P includes a plurality of capacitors formed of transistors. Referring to a portion A1 of the cell 10P, the portion A1 includes a capacitor unit of the cell 10P. Referring to the right-side subfigure of FIG. 1, the capacitor unit of the portion A1 includes two transistors Mp and Mn connected together.

The transistor Mp includes a gate terminal Gp and two source/drain terminals Sp and Dp, in which a channel (not separately shown) is arranged in the substrate of the transistor Mp between the two source/drain terminals Sp and Dp. A gate dielectric layer (not separately shown), which may be formed of silicon oxide, silicon nitride, silicon oxynitride, or a high-k dielectric layer, is arranged between the gate terminal Gp and the channel of the transistor Mp. In some embodiments, the transistor Mp is a P-type MOSFET.

Similarly, the transistor Mn includes a gate terminal Gn and two source/drain terminals Sn and Dn, in which a channel (not separately shown) is arranged in the substrate of the transistor Mn between the two source/drain terminals Sn and Dn. A gate dielectric layer (not separately shown), which may be formed of silicon oxide, silicon nitride, silicon oxynitride, or a high-k dielectric layer, is arranged between the gate terminal Gn and the channel of the transistor Mn. In some embodiments, the transistor Mn is an N-type MOSFET.

When the transistor Mp is configured as a capacitor, the two source/drain terminals Sp and Dp of the transistors Mp are connected together to serve as a first conductive plate of the pair of conductive plates of the capacitor Mp, the gate terminal Gp serves as a second conductive plate of the pair of conductive plates of the capacitor Mp, and the gate dielectric layer of the transistor Mp serves as the electrical insulating layer between the pair of conductive plates of the capacitor Mp.

When the transistor Mn is configured as a capacitor, the two source/drain terminals Sn and Dn of the transistors Mn are connected together to serve as a first conductive plate of the pair of conductive plates of the capacitor Mn, the gate terminal Gn serves as a second conductive plate of the pair of conductive plates of the capacitor Mn, and the gate dielectric layer of the transistor Mn serves as the electrical insulating layer between the pair of conductive plates of the capacitor Mn.

In some embodiments, the connected source/drain terminals Sp/Dp of the capacitor Mp are biased at a first supply voltage VDD, e.g., a positive voltage. Further, the connected source/drain terminals Sn/Dn of the capacitor Mn are biased at a second supply voltage VSS, e.g., a negative voltage, or substantially zero volts such as ground. Since the gate terminals Gp and Gn are connected, they can only be biased at the same supply voltage, e.g., the first supply voltage VDD or the second supply voltage VSS. As a result, when the connected gate terminals Gp/Gn are biased at the second supply voltage VSS, the transistor Mp is turned on and the transistor Mn is turned off, which means that the capacitor Mp is enabled while the capacitor Mn is disabled. Charges would accumulate on two sides of the gate dielectric layer of the transistor Mp. In some embodiments, the cell 10P is a decoupling capacitor cell, and the capacitors Mp and Mn are configured as decoupling capacitors (DCAPs) for filtering noise in an electronic circuit. The DCAPs may aid in stabilize the current and voltage level of the electronic circuit including the cell 10P.

Figure 2:
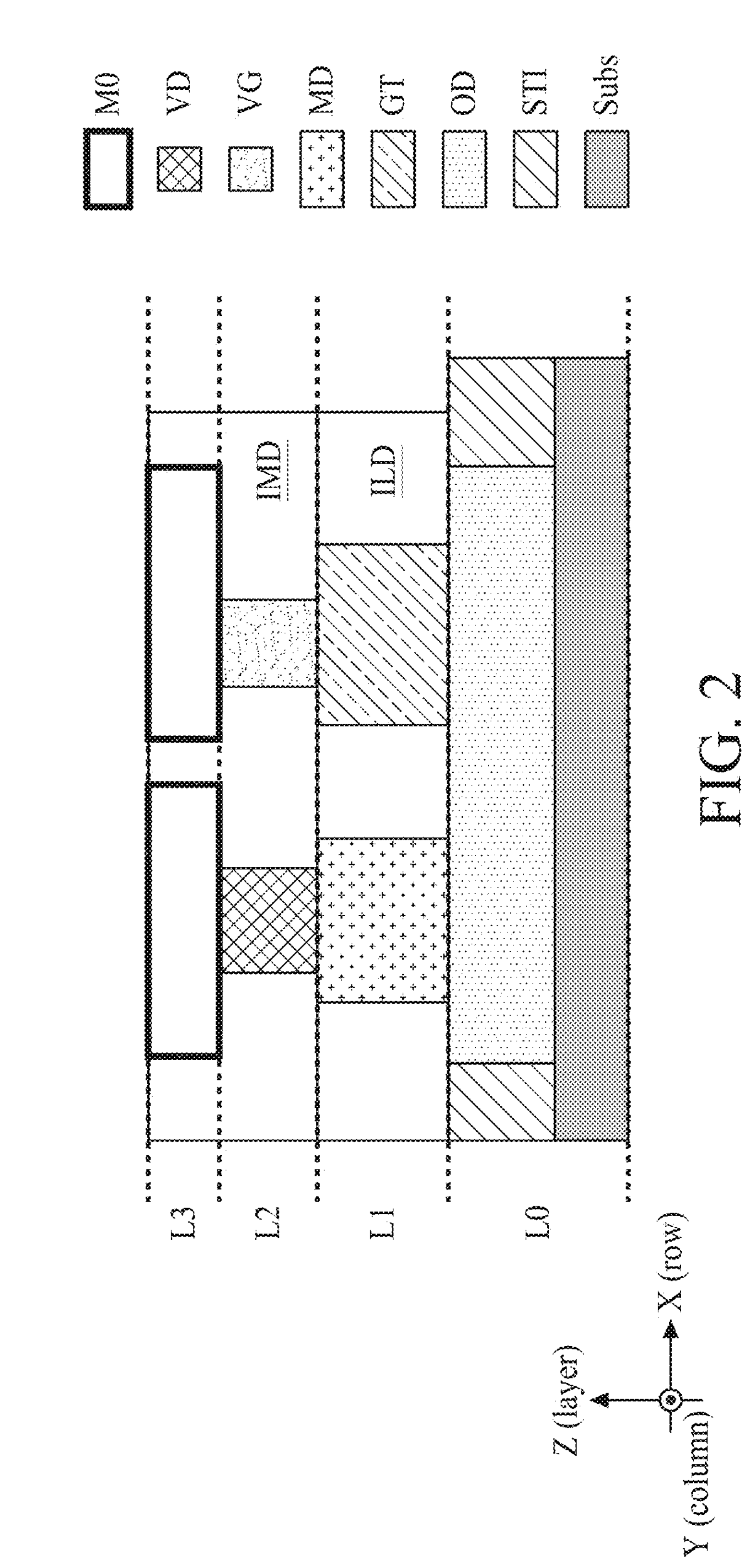
FIG. 2 shows a schematic block diagram of a cross-sectional view of circuit components arranged in a vertical direction, in accordance with some embodiments of the present disclosure.

Referring to the left-side subfigure of FIG. 1, the cell 10P includes a number (for example, eight) of transistors Mp arranged in parallel connection and a number (for example, eight) of transistors Mn arranged in parallel connection. Multiple layers of the cell 10P are illustrated and overlaid one another along with various patterns in the respective layers from a top-view perspective. FIG. 2 is a cross-sectional view 200 showing a vertical arrangement of the patterns in the respective layers of an example semiconductor device, such as the transistor Mp or Mn in the cell 10P, in accordance with some embodiments of the present disclosure.

Referring to FIG. 2, a substrate layer L0 is formed or provided, which may include a substrate material labelled by "Subs." In some embodiments, the substrate material Subs be formed of silicon or other suitable semiconductor materials. An active region OD is arranged in the substrate layer L0 and exposed through an upper surface of the substrate layer L0. Although not separately shown, the active region OD may include a first source/drain region, a second source/drain region and a channel region of the semiconductor device interposed between the two source/drain regions. Throughout the present disclosure, the source/drain region(s) may refer to a source or a drain, individually or collectively dependent upon the context. The source/drain regions in the active region may be an N-type active region doped with N-type impurities such as arsenic, phosphorus, or the like, or a P-type active region doped with P-type impurities such as boron or the like. The channel region in the active region OD may be undoped or lightly doped. In some embodiments, the upper surface of the active region OD is level with the lower surface of the gate electrode GT or the gate-layer conductive line MD. In some embodiments where a raised active region OD or a FinFFT device is adopted, the active region OD may have an upper surface higher than the upper surface of the substrate layer L0 and extends into a gate layer L1 over the substrate layer L0. In some embodiments, the substrate layer L0 further includes isolation structures defining and laterally surrounding the active region OD. In some embodiments, the isolation structures are formed of dielectric materials, such as oxide or nitride, and may be referred to as shallow trench isolation (STI). In some embodiments where the GAA FET (including a nanosheet FET or a nanowire FET) is adopted, the channel in the active region OD can be wrapped around by the gate electrode GT. In that case, the upper sublayer of the substrate layer L0 where the active region OD resides may be combined with the gate layer L1.

The gate electrode GT is provided in the gate layer L1 over the active region OD. The gate electrode GT may be formed of a conductive material, such as doped polysilicon, or formed of a metal gate comprising metallic materials such as tungsten, and cobalt, and other work function adjusting metals, such as Ti, Al, TiAl, TiN, TaC, and the like. Further, the gate-layer conductive line MD is also provided in the gate layer L1 over the active region OD adjacent to the gate electrode GT. Although not explicitly shown in FIG. 2, a gate dielectric layer formed of dielectric materials may be arranged between the channel region and the gate electrode GT.

A plurality of conductive line layers, e.g., layer L3 and a plurality of conductive via layers, e.g., layer L2, are provided as an interconnect structure over the gate layer L1. Each of the conductive line layers includes a plurality of parallel conductive lines, e.g., conductive lines M0, and each of the conductive via layers includes at least one conductive via, e.g., a gate via VG and a drain via VD. These conductive lines (including the gate-layer conductive line MD) and the conductive vias may be formed of conductive materials, such as copper, tungsten, aluminum, titanium, tantalum, alloys thereof, or the like.

The conductive line layers are electrically interconnected through the intervening conductive via layers. For example, the conductive line layer L3 and overlying conductive line layers (not separately shown) are arranged over one another and interconnected through the intervening conductive via layers. The conductive line layer L3 is further electrically connected to the gate layer L1 through the conductive via layer L2 therebetween, in which a conductive line M0 in the conductive line layer L3 is electrically connected to the gate electrode GT through a gate via VG, and another conductive line M0 is electrically connected to the gate-layer conductive line MD through a drain via VD. The numbers, configurations and materials of the conductive lines and conductive vias shown in FIG. 2 are for illustrative purposes only. Other numbers of layers, materials, and configurations of the semiconductor device is within the contemplated scope of the present disclosure.

In some embodiments, the abovementioned conductive lines and conductive vias are electrically insulated by electrical insulating materials, such as silicon oxide, silicon nitride, silicon oxynitride, silicon carbide, high-k dielectric materials, or other suitable dielectric materials. In some embodiments, the insulating materials formed in the gate layer L1 and laterally surrounding the gate electrode GT or the gate-layer conductive line MD are referred to herein as an inter-layer dielectric (ILD) layer, while the insulating materials formed in the layers L2, L3 or above and surrounding the conductive lines M0 and the conductive vias VD, VG are referred to herein as an inter-metal dielectric (IMD) layer.

Referring to FIG. 1, the cell 10P includes active regions (OD) 102P and 102N arranged in the substrate layer L0. The active regions 102P and 102N may extend in the row direction along the X-axis. In some embodiments, the active regions 102P and 102N are a P-type active region and an N-type active region, respectively. However, in other embodiments, the active regions 102P and 102N are an N-type active region and a P-type active region, respectively. The active regions 102P and 102N are defined and separated from each other by isolation structures STI (not separately shown in FIG. 1).

The cell 10P also includes a plurality of gate electrodes (GT) 104 disposed in the gate layer L1 over the active regions 102P and 102N. The gate electrodes 104 extends in the column direction along the Y-axis perpendicular to the X-axis. In some embodiments, the gate electrodes 104 serve as a functional gate electrode in forming a MOSFET device.

The cell 10P further includes two cell-edge gate electrodes (GT) 105 in the gate layer L1 that extend in the column direction on a left cell side and a right cell side, respectively, of the cell 10P. The cell-edge gate electrodes 105 are parallel to the gate electrodes 104. In some embodiments, the cell-edge gate electrodes 105 are not functioning as a component of a FET device. A gate electrode pitch pGT is defined as a pitch of adjacent gate electrodes (e.g., the gate electrodes 104) or between one gate electrode 104 and one adjacent cell-edge gate electrodes 105.

Source/drain regions SD1 and SD2 are defined in the active region 102P and delimited by the gate electrode 104 and the cell-edge gate electrodes 105, in which the source/drain regions SD1 and SD2 correspond to the source terminal Sp and drain terminal Dp, respectively, of the transistor Mp of FIG. 1. The active region 102P covered by the gate electrode 104 between the source/drain regions SD1 and SD2 is defined as the channel region of the transistor Mp. Similarly, Source/drain regions SD3 and SD4 are defined in the active region 102N and delimited by the gate electrode 104 and the cell-edge gate electrode 105, in which the source/drain regions SD3 and SD4 correspond to the source terminal and drain terminal, respectively, of the transistor Mn of FIG. 1. The active region 102N covered by the gate electrode 104 between the source/drain regions SD3 and SD4 is defined as the channel region of the transistor Mn.

In some embodiments, the cell 10P further includes first gate-layer conductive lines (MD) 106 arranged in the gate layer L1. The first gate-layer conductive lines 106 are arranged parallel to and alternatively with the gate electrodes 104 over the active region 102P. In some embodiments, the cell 10P also includes second gate-layer conductive lines (MD) 206 arranged in the gate layer L1. The second gate-layer conductive lines 206 are arranged parallel to and alternatively with the gate electrodes 104 over the active region 102N. In some embodiments, the cell 10P includes a partition layer 108, also referred to as a cut-MD (CMD) layer, extending in the X-axis and arranged between the first gate-layer conductive lines 106 and the second gate-layer conductive lines 206. Although the first gate-layer conductive lines 106 and the second gate-layer conductive lines 206 illustrated in FIG. 1 seem to be connected, they are actually separated apart at the middle portion of the cell 10P by the partition layer 108. In other words, each of the first gate-layer conductive lines 106 is aligned with a corresponding second gate-layer conductive lines 206 along the column direction, and each of the first gate-layer conductive lines 106 is separated from the corresponding second gate-layer conductive lines 206 by a distance equal to the width, measured in the column direction, of the partition layer 108.

The cell 10P further includes power rails (M0) 112 and conductive lines (M0) 114 arranged in the conductive line layer L3 and extending in the row direction. The power rails 112, which includes power rails 112A and 112B, and conductive lines 114, which includes conductive lines 114A, 114B, 114C, 114D and 114E, are arranged in parallel, in which the power rails 112A and 112B are arranged on an upper cell side and a lower cell side, respectively, of the cell 10P. In some embodiments, the power rails 112A and 112B are configured to supply a first voltage VDD and a second voltage VSS, respectively. In some embodiments, the first voltage VDD is a positive voltage and the second voltage VSS is ground or a negative voltage.

In some embodiments, the power rails 112 have substantially equal widths in the column direction, and the conductive lines 114 have substantially equal widths in the column direction. The power rail 112 may have a width greater than the width of the conductive line 114. The conductive lines 114 are equally spaced by a spacing Pc between the power rails 112A and 112B in the column direction. Throughout the present disclosure, the space of the cell 10P in the third layer L3 between the power rails 112A and 112B accommodating the conductive lines 114 are represented in terms of tracks, where each conductive line 114 occupies one track and a spacing between adjacent tracks or between a power rail 112 and an adjacent track is equal to Pc. In the depicted embodiment, the number of the tracks or the conductive lines 114 is five. In some other embodiment, the number of the conductive lines 114 is greater or less than five.

The cell 10P also includes one or more conductive vias 116, 118, 126, 128, 136 in the conductive via layer L2 for electrically connecting the gate layer L1 to the conductive line layer L3. The conductive vias 116, 126 and 136 is configured as gate vias overlapping the gate electrodes 104 and electrically connect the gate electrodes 104 to the conductive line 114A, 114C or 114E, respectively. The conductive vias 118 and 128 are configured as drain vias overlapping the first gate-layer conductive line 106 and the second gate-layer conductive line 206, respectively, and electrically connect the gate-layer conductive line 106, 206 to the conductive lines 114B and 114E, respectively. In some embodiments, the cell 10P further includes conductive vias 120 (VMD) configured as power vias and overlapping the power rails 112A and 112B to electrically connect the gate-layer conductive lines 106 and 206 to the power rails 112A and 112B, respectively.

In some embodiments, each conductive line 114 is electrically coupled to the first supply voltage VDD, the second supply voltage VSS, or is configured as electrically floating. For example, in the depicted example, the conductive line 114B is electrically coupled to the first supply voltage VDD, and thus is labelled as "M0-D." Further, the conductive lines 114A, 114C and 114E are electrically coupled to the second supply voltage VSS, and thus is labelled as "M0-S." In some embodiments, the conductive line 114D is electrically floating and serve as an unused conductive line, and thus is labelled as "M0-U."

Figure 3:
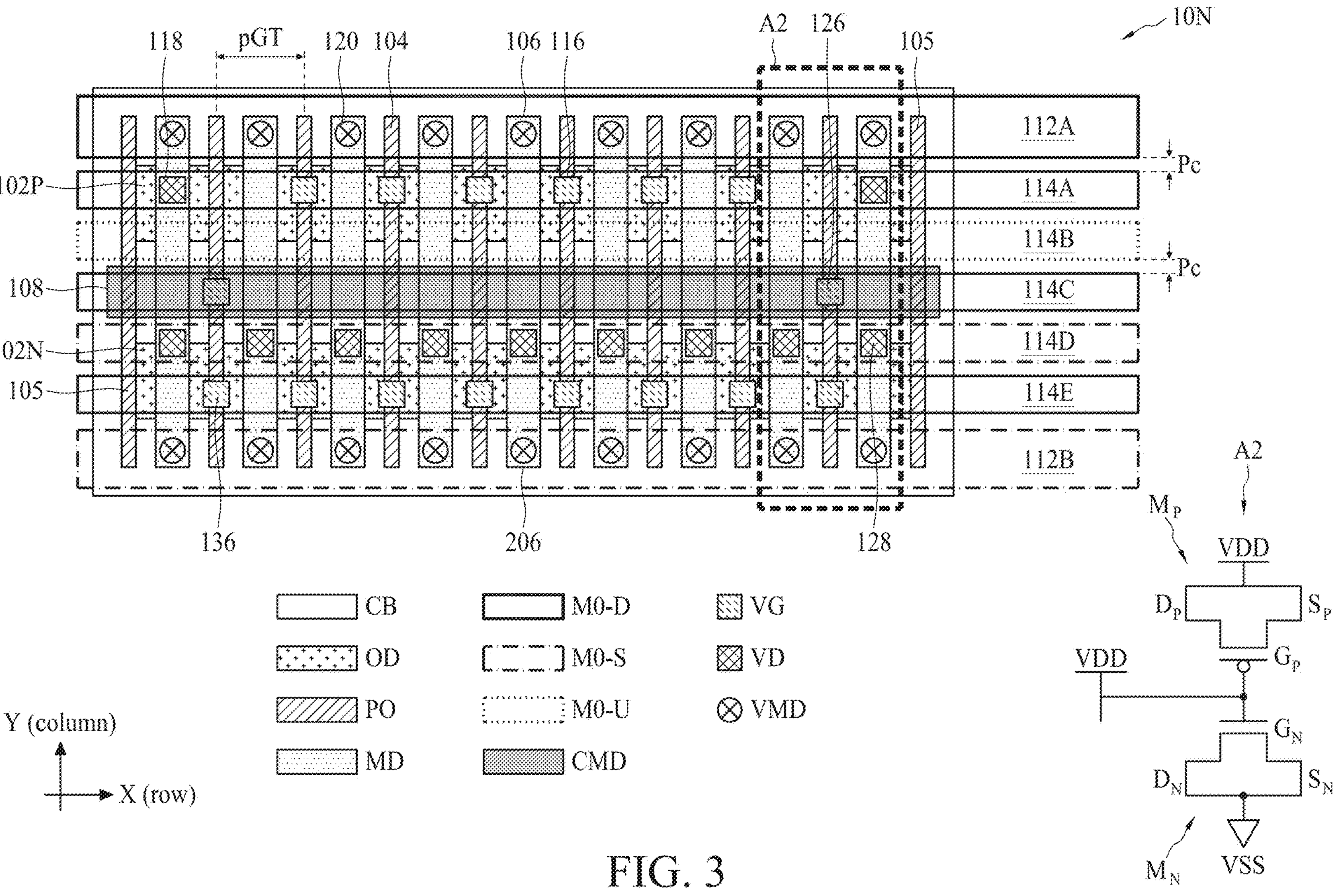
FIG. 3 shows a schematic block diagram and an example electronic circuit of a cell, in accordance with some embodiments of the present disclosure.

FIG. 3 shows a schematic block diagram and an example electronic circuit of a cell 10N, in accordance with some embodiments of the present disclosure. Referring to a portion A2 of the cell 10N, the portion A2 includes a capacitor unit of the cell 10N. Referring to the right-side subfigure of FIG. 1, the capacitor unit of the portion A2 includes two transistors Mp and Mn connected together. In some embodiments, the cell 10N and the electronic circuit of the portion A2 shown in FIG. 2 are similar to the cell 10 and the portion A1, except that the connected gate terminals Gp and Gn are biased at the first supply voltage VDD in the cell 10N. As a result, the transistor Mp is turned off and the transistor Mn is turned on, which means that the capacitor Mp is disabled, while the capacitor Mn is enabled. Charges would accumulate on two sides of the gate dielectric layer of the transistor Mn. Further, the conductive lines 114A, 114C and 114E are electrically coupled to the first supply voltage VDD, and thus the gate vias 116, 126, 136 and the drain vias 118 are biased at the first supply voltage VDD. The conductive line 114D is electrically coupled to the second supply voltage VSS, and thus the drain vias 128 are biased at the second supply voltage VSS. The conductive line 114B is electrically floating, and thus is not electrically coupled to conductive vias or other conductive member of the cell 10. In some embodiments, the gate vias 116 or 136 or the drain vias 118 are arranged in a row. In some embodiments, two drain vias 128 are arranged on two sides of the row of the gate vias 136 and electrically couple the gate-layer conductive lines 206 to the conductive line 114E.

In some embodiments, the distance between the conductive line 114B, to which the drain vias 118 is coupled, and the power rail 112A is less than the distance between the conductive line 114B and the power rail 112B. In some embodiments, the conductive line 114B, to which the drain vias 118 is coupled, overlaps the active region 102P and is non-overlapped with the active region 102N.

Referring to FIGS. 1 and 2, as discussed previously, the IMD layer or the ILD layer surround the conductive members, e.g., the gate electrode (GT) 104, the first and second gate-layer conductive lines (MD) 106 and 206, the gate vias (VG) 116, 126 and 136, the drain vias (VD) 118, 128, and the conductive lines (M0) 114. When two ends of a portion of the ILD layer or the IMD layer include conductive members biased to different supply voltages, two effects spontaneously occur.

The first effect is the capacitive effect, where a parasitic capacitor is formed and the ILD layer or the IMD layer serves as the electrical insulating layer of the parasitic capacitor. The capacitive effect may be useful in some examples to increase the decoupling capacitance of the cell 10, thereby improving the device performance of the cell 10.

The second effect is dielectric voltage stress effect, which is caused by the same source of the voltage potential differential on the two ends of the ILD layer or the IMD layer. As time goes by, the dielectric property of the ILD layer or the IMD layer may be degraded due to the persistent voltage stress exerted thereon, and an undesired phenomenon referred to as time-dependent dielectric breakdown (TDDB) effect may occur to the ILD layer or IMD layer to cause failure of the dielectric property of the ILD layer or the IMD layer.

The TDDB effect may seriously degrade the lifetime of the semiconductor device since the TDDB effect may cause current leakage through the ILD layer or IMD layer where current leakage should be blocked. As a result, the reliability issue of the semiconductor device becomes as important as the performance improvement for some types of semiconductor devices that are required to operate for a long time with high reliability, such as those for medical purposes, high voltage applications, those used in high temperature environments, and the like.

Figure 8:
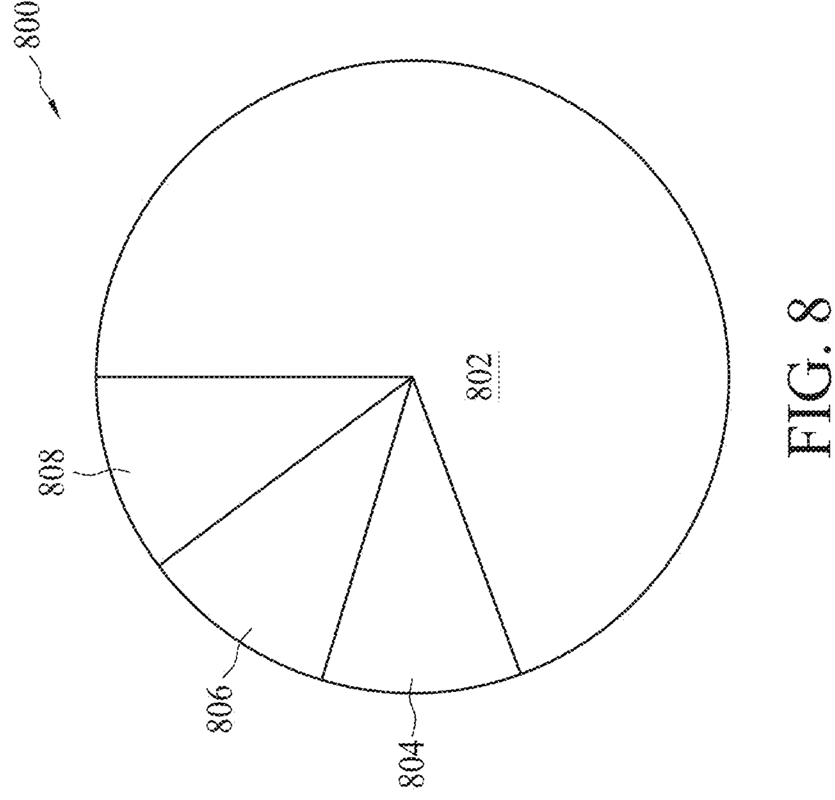
FIG. 8 shows a schematic pie chart of a percentage distribution of different types of capacitances in a circuit, in accordance with some embodiments of the present disclosure.

FIG. 8 shows a schematic pie chart 800 of a percentage distribution of different types of capacitances in an example electronic circuit, in accordance with some embodiments of the present disclosure. In the depicted embodiment, the example electronic circuit is formed according to a decoupling capacitor cell, e.g., cell 10P or 10N shown in FIG. 1 or FIG. 3. As far as the example electronic circuit is concerned, the overall capacitance can be categorized into four portions 802, 804, 806 and 808, contributed by four respective contributors.

The first portion 802 of the capacitance is contributed by a first type coupling capacitance formed between the gate electrodes 104 and the channel of the transistors Mp or Mn when the transistors Mp or Mn are configured as decoupling capacitors and turned on. In some embodiments, the first portion 802 accounts for more than one half or even approximately two third of the total decoupling capacitance of the cell 10P or 10N, as shown in the pie chart 800.

The second portion 804 is contributed by a second type coupling capacitance formed between the gate electrodes 104 and their adjacent gate-layer conductive lines 106, 206 when they are biased at different supply voltages, in which the second portion 804 accounts for about 10% of the total decoupling capacitance.

The third portion 806 is contributed by a third type coupling capacitance formed related to the conductive lines 114, e.g., formed between the adjacent conductive lines 114 when they are biased at different voltages, in which the third portion 806 accounts for about 10% of the total decoupling capacitance. In some other embodiments, the third type coupling capacitance is formed between the overlapping portions of the conductive lines 114 and adjacent first gate-layer conductive lines 106, between the overlapping portions of the conductive lines 114 and adjacent second gate-layer conductive lines 206. In some other embodiments, the third type coupling capacitance is formed between the overlapping portions of the conductive lines 114 and adjacent the gate electrodes 104.

The fourth portion 808 is contributed by a fourth type coupling capacitance found in any parasitic capacitor not belonging to the abovementioned types, in which the fourth portion 808 accounts for about 10% of the total decoupling capacitance. In some other embodiments, the fourth type coupling capacitance is formed between the drain vias 118, 128 and the adjacent gate electrodes 104. In some other embodiments, the fourth type coupling capacitance is formed between the gate vias 116, 126, 136 and the adjacent first or second gate-layer conductive lines 106 or 206. In some other embodiments, the fourth type coupling capacitance is formed between an N-type well region in the substrate and the P-type substrate.

Persons of ordinary skill should appreciate that the actual percentages of the portions 802, 804, 806 and 808 for the total decoupling capacitance illustrated in the pie chart 800 may differ for different semiconductor devices and different configurations thereof, and the schematic pie chart 800 is shown for illustrative purposes only.

The decoupling capacitance is beneficial for proper operation of a semiconductor device. Further, the generation of the decoupling capacitance relies on the voltage potential differential exerted on the ILD layer, the IMD layer or the gate dielectric layer of the transistor Mp, Mn. As discussed previously, the capacitive effect comes with the TDDB effect, which eventually leads to the source of current leakage. Nevertheless, the decrease of the TDDB effect may not necessarily be proportional to the decrease of the decoupling capacitance in each of the capacitance contributors represented by the respective portions 802, 804, 806 and 808. For example, the amount of the first type decoupling capacitance corresponding to the first portion 802 may be maintained regardless of the rearrangement of the conductive vias VG, VD or the conductive lines 114 of the cell 10P or 10N. Similarly, in some embodiments, the dielectric voltage stress level for the second to fourth type decoupling capacitance can be greatly decreased by rearrangement of the conductive vias VG, VD or the conductive lines 114 at the price of minor loss of the capacitance. As such, it is desirable to revise the cell 10P or 10N to maintain a major amount of the decoupling capacitance while decreasing most of the instances of the dielectric voltage stress in the cell 10P or 10N. Therefore, the device performance would not be seriously impacted, but the TDDB effect can be greatly relieved, and the device durability can be improved with minor or negligible performance loss.

FIGS. 4A, 4B, 4C, 5A, 5B, 5C, 5D, 5E, 6A, 6B, 7A and 7B are schematic block diagrams of various cells, in accordance with various embodiments of the present disclosure. To simplify the drawings and make the important features more visible, the power rails 112 and the conductive lines 114 are not shown in their actual lengths in the following figures. Instead, a portion of each of the power rails 112 and the conductive lines 114 are illustrated to the right-hand side of the cell layout to indicate their (track) locations in the column direction. Therefore, when viewing the figures without the complete lengths of the power rails 112 or the conductive lines 114, one shall spontaneously extend these power rails 112 and conductive lines 114 along the row direction through the design layout to assume contact between these power rails 112 or conductive lines 114 with the overlapping conductive vias.

Figure 4A:
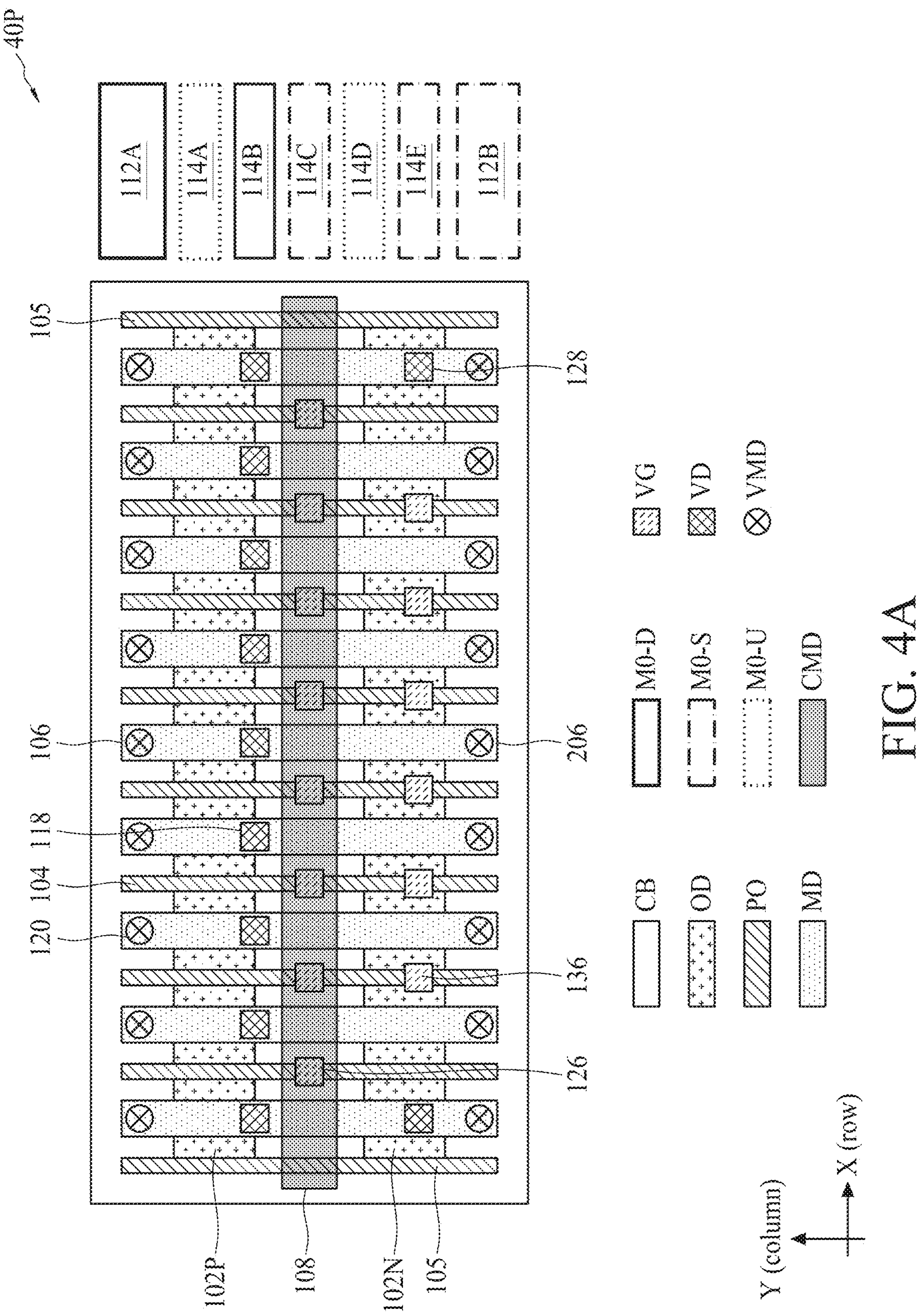
FIGS. 4A, 4B and 4C are schematic block diagrams of cells, in accordance with various embodiments of the present disclosure.

FIG. 4A is a schematic block diagram of a cell 40P, in accordance with various embodiments of the present disclosure. The cell 40P is similar to the cell 10P in many aspects, and thus these similar features will not be repeated herein for brevity. Referring to FIG. 1 and FIG. 4A, the cell 40P differs from the cell 10P mainly in that the gate vias 116 electrically coupled to the conductive line (M0-D) 114A and overlapping the first active region 102P are removed or reallocated. Instead, the number of the gate vias 126 are increased from two to eight due to the movement of the gate vias 116. In other words, the central six gate vias 116 are moved downward to be electrically coupled to the conductive line 114C. In some embodiments, the leftmost one and the rightmost one of the row of gate vias 116 of the cell 10P are removed from the cell 40P.

In some embodiments, the gate vias 126 moved from the gate vias 116 are arranged between the first gate-layer conductive lines 106 and the second gate-layer conductive lines 206 from a top-view perspective. In some embodiments, the moved gate vias 126 overlap the partition layer (CMD) 108 from a top-view perspective. As a result, a fourth type decoupling capacitance (and the accompanying number of occurrences of dielectric voltage effect) formed between the gate vias 116 and the first gate-layer conductive lines 106 that would otherwise be present in the cell 10P is now removed from the cell 40P. Moreover, a third type decoupling capacitance (and the accompanying number of occurrences of dielectric voltage effect) formed between the conductive line 114A and the power rail 112A or the conductive line 114B is removed. The risk of potential TDDB on the IMD layer between the gate vias 116 and the first gate-layer conductive lines 106 is relieved at the same time. Further, it shall be noted that no decoupling capacitance is formed between the gate vias 136 and the second gate-layer conductive lines 206 in the cell 40P. That is because both of the gate vias 136 and the second gate-layer conductive lines 206 are electrically coupled to a same voltage level, e.g., the second supply voltage VSS.

Figure 4B:
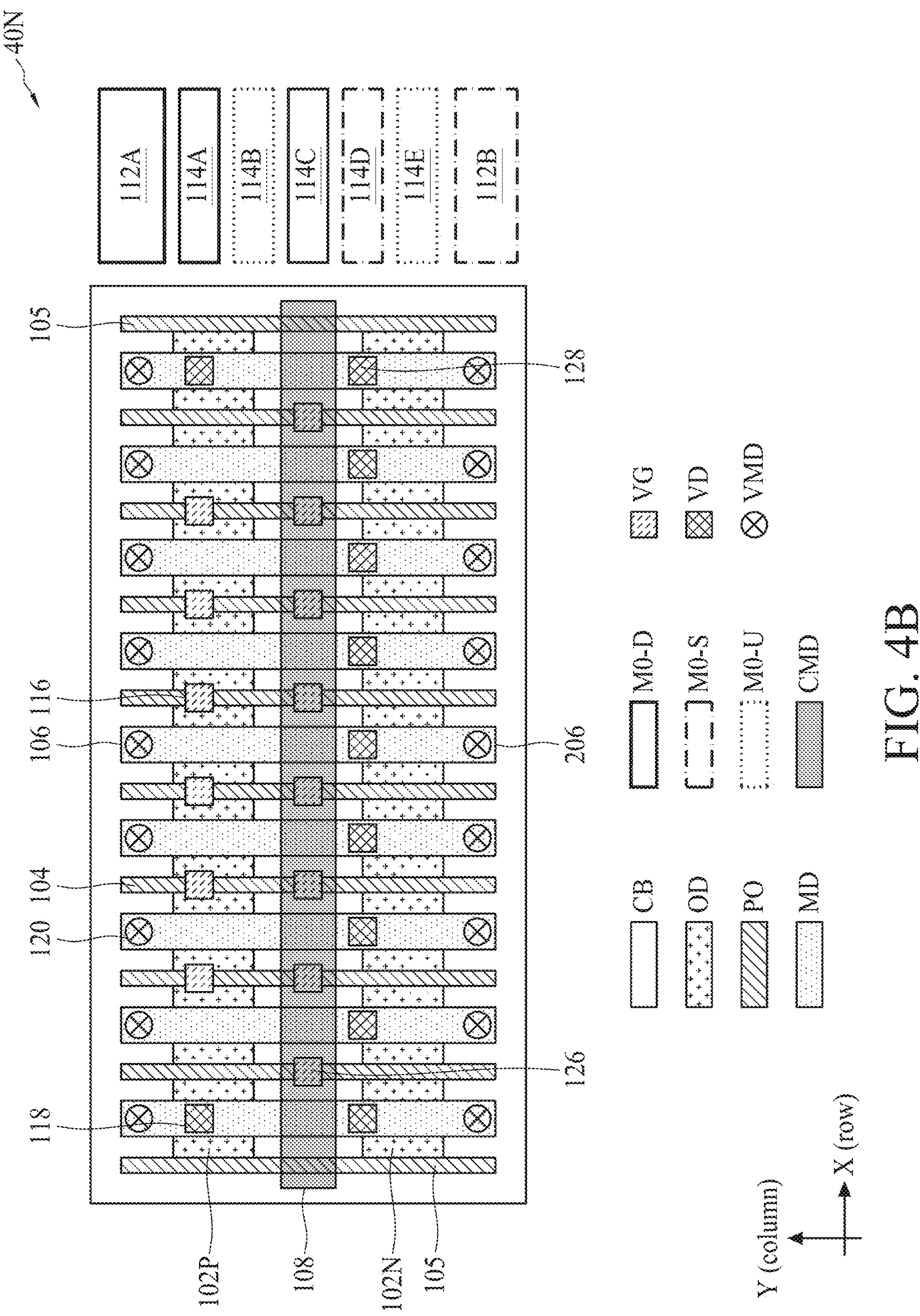

FIG. 4B is a schematic block diagram of a cell 40N, in accordance with various embodiments of the present disclosure. The cell 40N is similar to the cell 10N in many aspects, and thus these similar features will not be repeated herein for brevity. Referring to FIG. 3 and FIG. 4B, the cell 40N differs from the cell 10N mainly in that the gate vias 116 electrically coupled to the conductive line 114A and overlapping the first active region 102P of the cell 10N are removed or reallocated. Instead, the number of the gate vias 126 are increased from two to eight. In other words, the gate vias 136 are moved upward to be electrically coupled to the conductive line 114C. In some embodiments, the leftmost one and the rightmost one of the row of gate vias 136 of the cell 10N are removed from the cell 40N.

In some embodiments, the gate vias 126 moved from the gate vias 136 are arranged between the first gate-layer conductive lines 106 and the second gate-layer conductive lines 206 from a top-view perspective. In some embodiments, the moved gate vias 126 overlap the partition layer (CMD) 108 from a top-view perspective. As a result, a fourth type decoupling capacitance (and the accompanying number of occurrences of dielectric voltage effect) formed between the gate vias 136 and the second gate-layer conductive lines 206 that would otherwise be present in the cell 10N is now removed from the cell 40N. Also, the risk of potential TDDB on the IMD layer between the gate vias 136 and the second gate-layer conductive lines 206 is relieved at the same time. Further, it shall be noted that no decoupling capacitance is formed between the gate vias 116 and the first gate-layer conductive lines 106. That is because both of the gate vias 116 and the first gate-layer conductive lines 106 are electrically coupled to a same voltage level, e.g., the first supply voltage VDD.

Figure 4C:
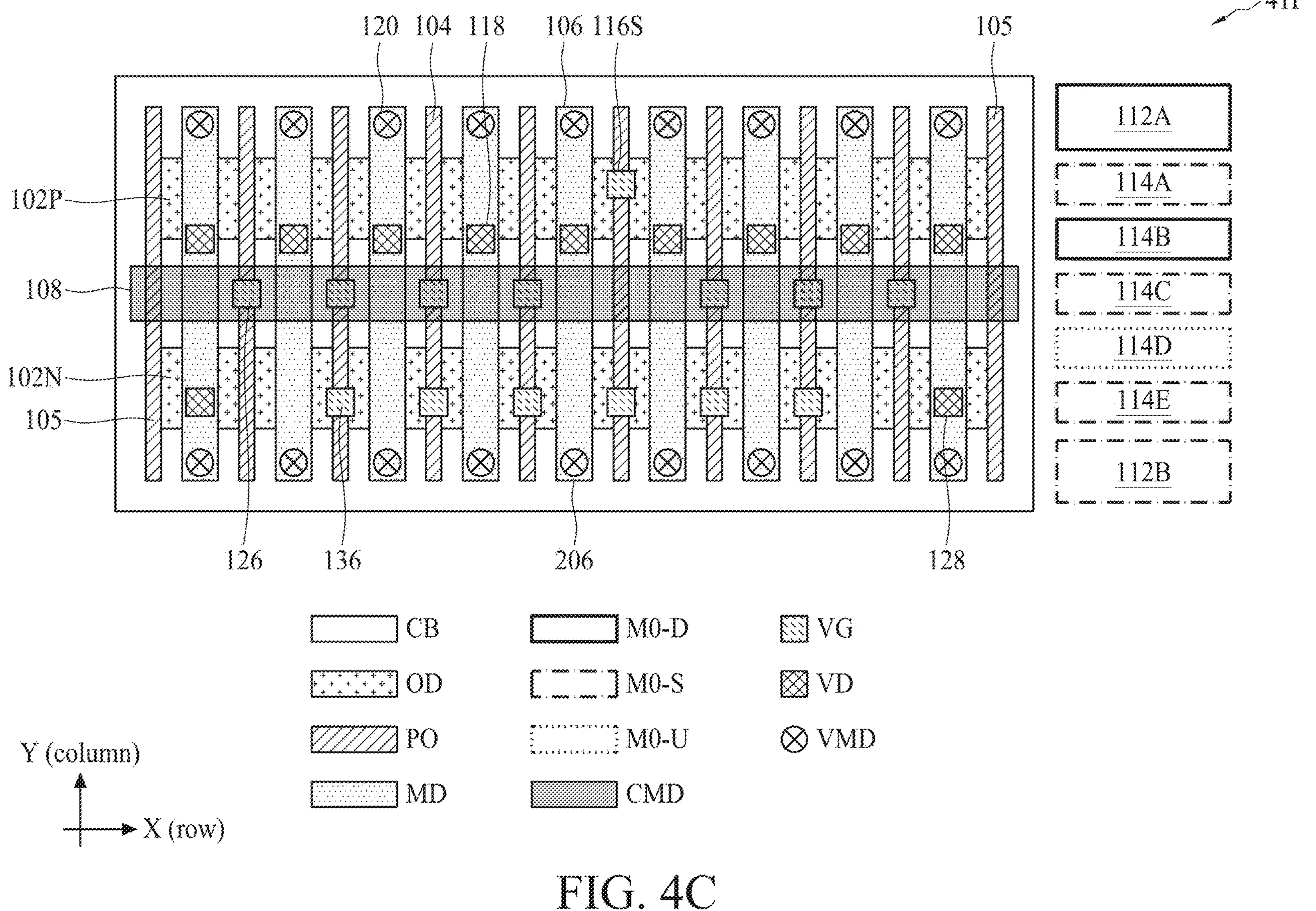

FIG. 4C is a schematic block diagram of a cell 41P, in accordance with various embodiments of the present disclosure. The cell 41P is similar to the cell 40P in many aspects, and thus these similar features will not be repeated herein for brevity. Referring to FIG. 4A and FIG. 4C, the cell 41P differs from the cell 40P mainly in that only a single gate via 116S remains on the conductive line 114A and overlaps the first active region 102P. In other words, the conductive line 114A is now converted from an electrically floating conductive line in the cell 40P back be electrically coupled to the second supply voltage VSS. In some embodiments, the conductive line 114C is free from any gate vias or drain vias coupled thereto. As a result, a third type decoupling capacitance formed between the conductive line 114A and the power rail 112A or the conductive line 114B can be preserved, just like the cell 10P, while the induced occurrence of the TDDB effect is increased only by one instance of the gate via 116S, which is much less than the eight instances of the gate vias 116 in the cell 10P shown in FIG. 1. Therefore, the risk of potential TDDB on the IMD layer between the gate vias 116 and the first gate-layer conductive lines 106 is relieved.

In some embodiments, the distance between the conductive line 114A, to which the gate via 116S is coupled, and the power rail 112A is less than the distance between the conductive line 114A and the power rail 112B. In some embodiments, the conductive line 114A, to which the gate via 116S is coupled, overlaps the active region 102P and is non-overlapped with the active region 102N. In some embodiments, the gate via 116S is arranged between the power rail 112A and the drain vias 118.

Figure 5A:
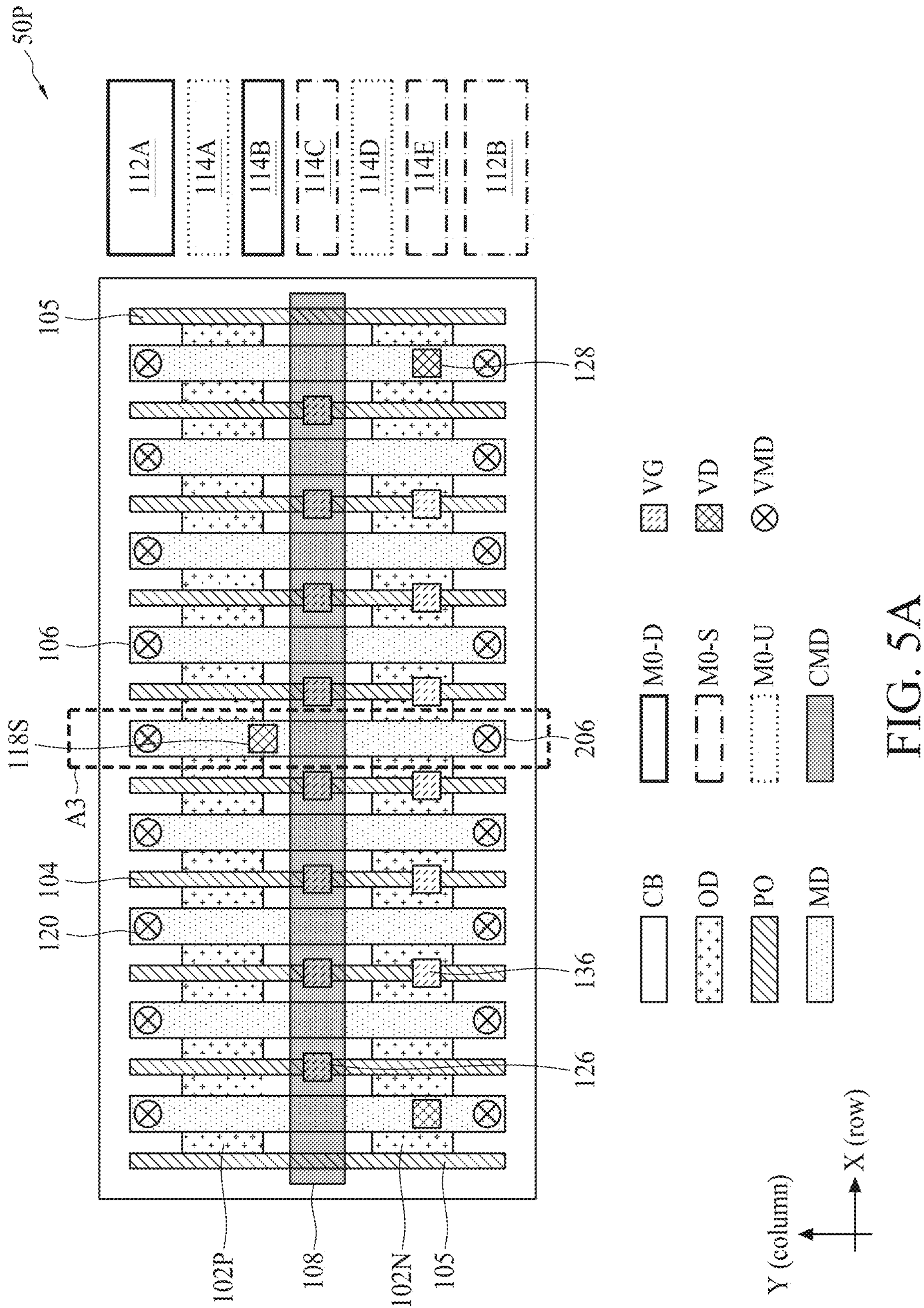
FIGS. 5A, 5B, 5C, 5D and 5E are schematic block diagrams of cells, in accordance with various embodiments of the present disclosure.

FIG. 5A is a schematic block diagram of a cell 50P, in accordance with some embodiments of the present disclosure. The cell 50P is similar to the cell 40P in many aspects, and thus these similar features will not be repeated herein for brevity. Referring to FIG. 4A and FIG. 5A, the cell 50P differs from the cell 40P mainly in that only a single drain via 118S remains on the conductive line 114B and overlaps the first active region 102P, as shown in the portion A3 of the cell 50P. The conductive line 114B is free from any gate vias or drain vias coupled thereto. As a result, a fourth type decoupling capacitance formed between the drain vias 118 and the gate electrodes 104 can be reduced, while the accompanying TDDB effect is also decreased at the same time. However, the influence of the reduced TDDB effect is much more than the influence of the decreased decoupling capacitance. Therefore, the risk of potential TDDB on the IMD layer between the drain via 118S and the gate electrodes 104 is relieved with negligible performance loss.

Figure 5B:
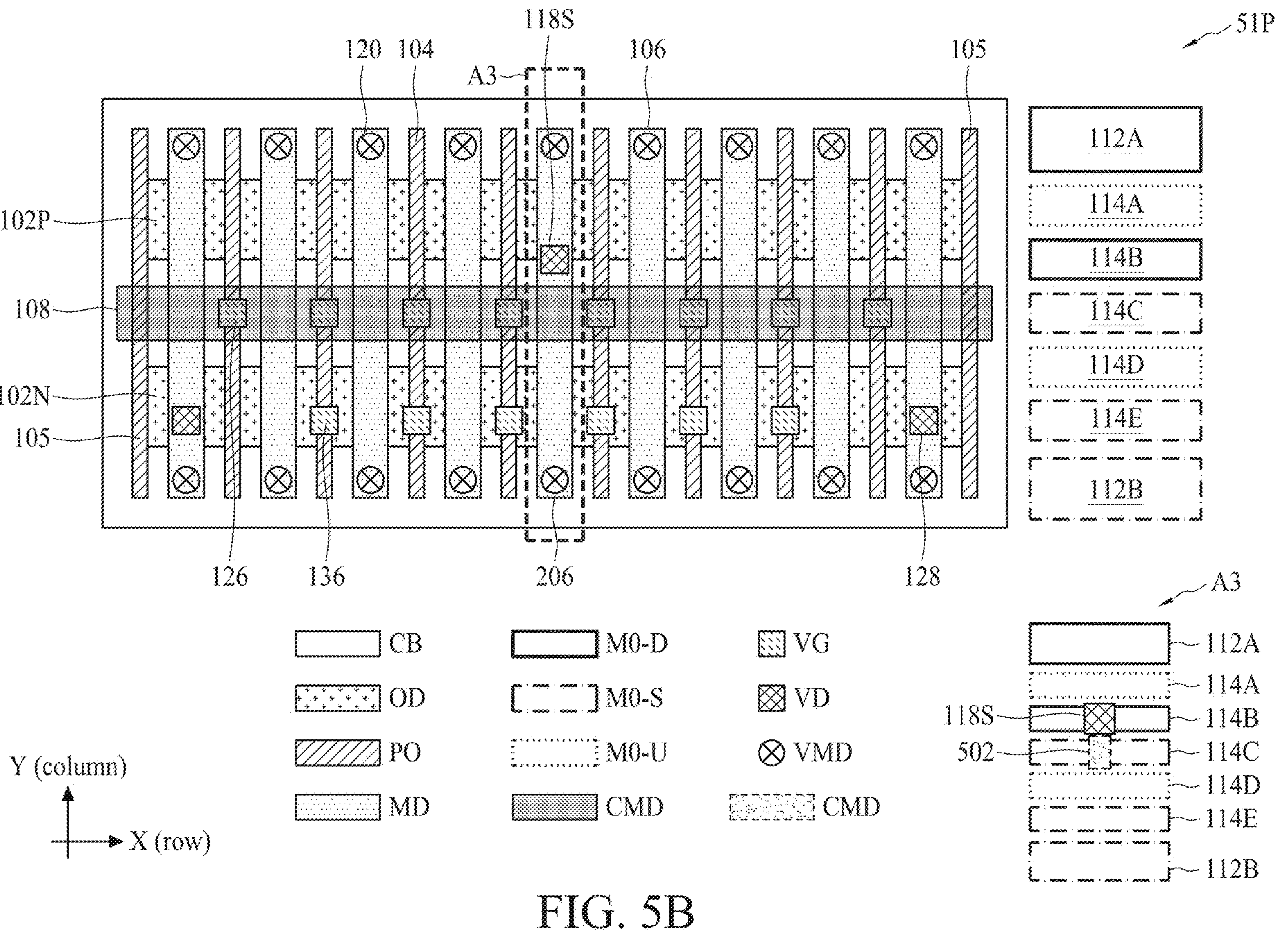

FIG. 5B is a schematic block diagram of a cell 51P, in accordance with some embodiments of the present disclosure. The cell 51P is similar to the cell 50P in many aspects, and thus these similar features will not be repeated herein for brevity. Referring to the portions A3 of FIG. 5A and FIG. 5B, the cell 51P differs from the cell 50P mainly in that an opening 502 is formed in the conductive line 114C. In some embodiments, the opening 502 cuts the conductive line 114C into two separate conductive line segments. In some embodiments, the opening 502 is aligned with the drain via 118S in the column direction. Since the conductive lines 114B and 114C are electrically coupled to different supply voltages, the formation of the opening 502 readily removes a majority of the coupling capacitance and dielectric voltage stress between the conductive line 114B (and the drain via 118S) and the conductive line 114C. As a result, a fourth type decoupling capacitance formed between the drain vias 118 and the conductive line 114C can be reduced, while the accompanying TDDB effect is also decreased. However, the influence of the reduced TDDB effect is much more than the influence of the decreased decoupling capacitance. Therefore, the risk of potential TDDB on the IMD layer between the drain vias 118S and the conductive line 114C is relieved with negligible performance loss.

In some embodiments, the distance between the conductive line 114B, to which the drain via 118S is coupled, and the power rail 112A is less than the distance between the conductive line 114B and the power rail 112B. In some embodiments, the conductive line 114A, to which the drain via 118S is coupled, overlaps the active region 102P and is non-overlapped with the active region 102N. In some embodiments, the drain via 118S is arranged between the power rail 112A and the gate vias 126.

Figure 5C:
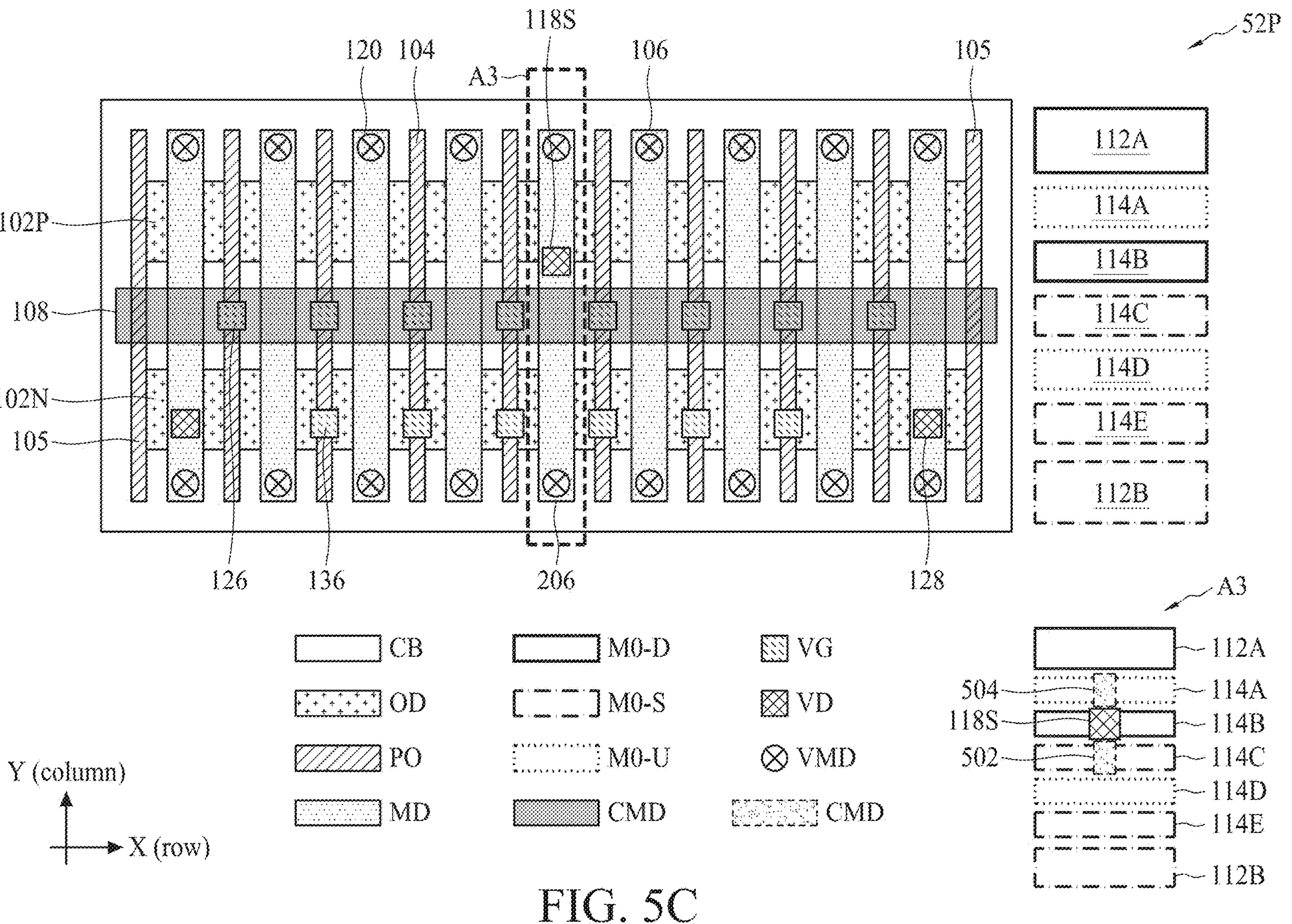

FIG. 5C is a schematic block diagram of a cell 52P, in accordance with some embodiments of the present disclosure. The cell 52P is similar to the cell 51P in many aspects, and thus these similar features will not be repeated herein for brevity. Referring to the portions A3 of FIG. 5B and FIG. 5C, the cell 52P differs from the cell 51P mainly in that another opening 504 is formed in the conductive line 114A on one side of the drain via 118S opposite to the opening 502. In some embodiments, the opening 504 cuts the conductive line 114A into two separate conductive line segments. In some embodiments, the opening 504 is aligned with the drain via 118S or the opening 502 in the column direction. The formation of the opening 504 readily removes a majority of the coupling capacitance and dielectric voltage stress between the conductive line 114B (and the drain via 118S) and the conductive line 114A. As a result, a fourth type decoupling capacitance formed between the drain vias 118 and the conductive line 114A can be reduced, while the accompanying TDDB effect is also decreased. However, the influence of the reduced TDDB effect is much more than the influence of the decreased decoupling capacitance. Therefore, the risk of potential TDDB on the IMD layer between the drain via 118S and the conductive line 114A is relieved with negligible performance loss.

Figure 5D:
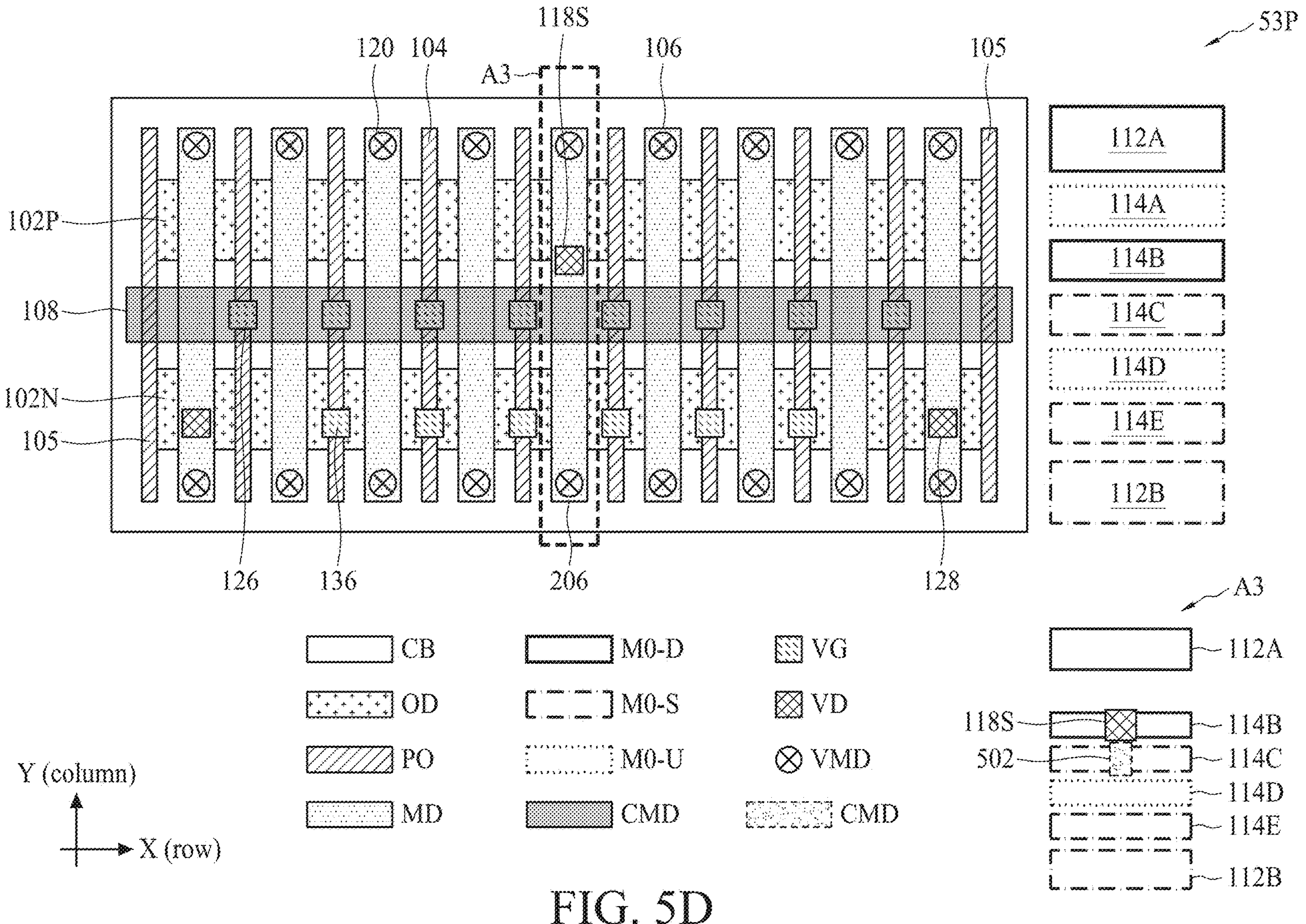

FIG. 5D is a schematic block diagram of a cell 53P, in accordance with some embodiments of the present disclosure. The cell 53P is similar to the cell 52P in many aspects, and thus these similar features will not be repeated herein for brevity. Referring to the portions A3 of FIG. 5C and FIG. 5D, the cell 53P differs from the cell 52P mainly in the removal of the entire conductive line 114A from one side of the conductive line 114B opposite to the opening 502. The removal of the conductive line 114A readily removes a totality of the coupling capacitance and dielectric voltage stress between the conductive line 114B (and the drain via 118S) and the conductive line 114A. As a result, a fourth type decoupling capacitance formed between the drain vias 118 and the conductive line 114A can be reduced, while the accompanying TDDB effect is also decreased. However, the influence of the reduced TDDB effect is much more than the influence of the decreased decoupling capacitance. Therefore, the risk of potential TDDB on the IMD layer between the drain via 118S and the conductive line 114A is relieved with negligible performance loss.

Figure 5E:
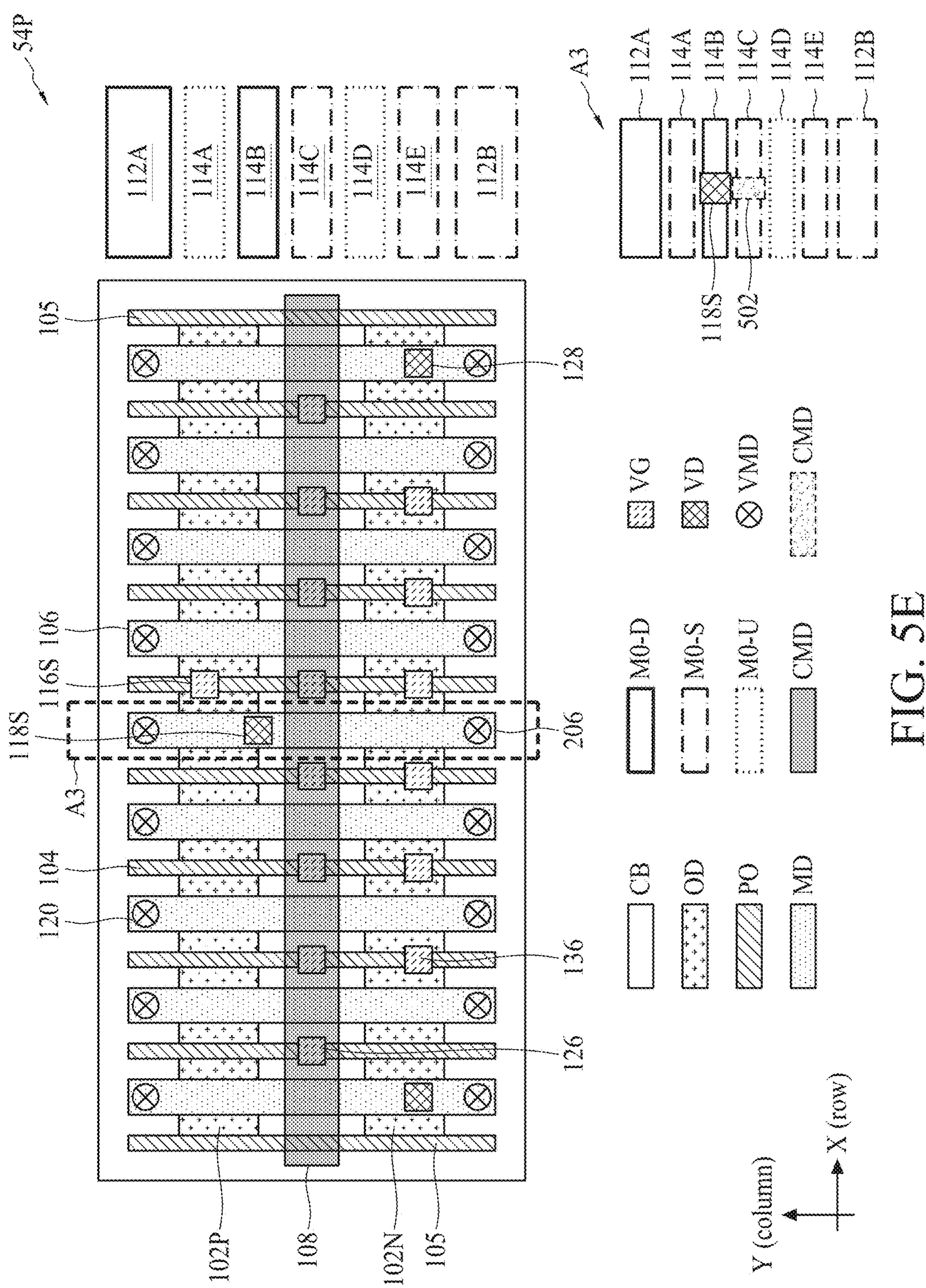

FIG. 5E is a schematic block diagram of a cell 54P, in accordance with some embodiments of the present disclosure. The cell 54P is similar to the cell 51P in many aspects, and thus these similar features will not be repeated herein for brevity. Referring to FIG. 4C and the portions A3 of FIG. 5B and FIG. 5E, the cell 54P can be regarded as a combination of the cell 41P and the cell 51P. The reservation of the single gate via 116S can help capturing a majority of the second type coupling capacitance between the conductive lines 114A and the power rail 112A or the conductive line 114B, while the formation of the opening 502 help reduce a majority of the dielectric voltage stress between the conductive via 118S and the conductive line 114C. Although not separately shown, one of ordinary skill in the art can readily generate another new cell having the desired effect similar to the cell 54P through combination of the cell 41P with the cell 52P or 53P.

Figure 6A:
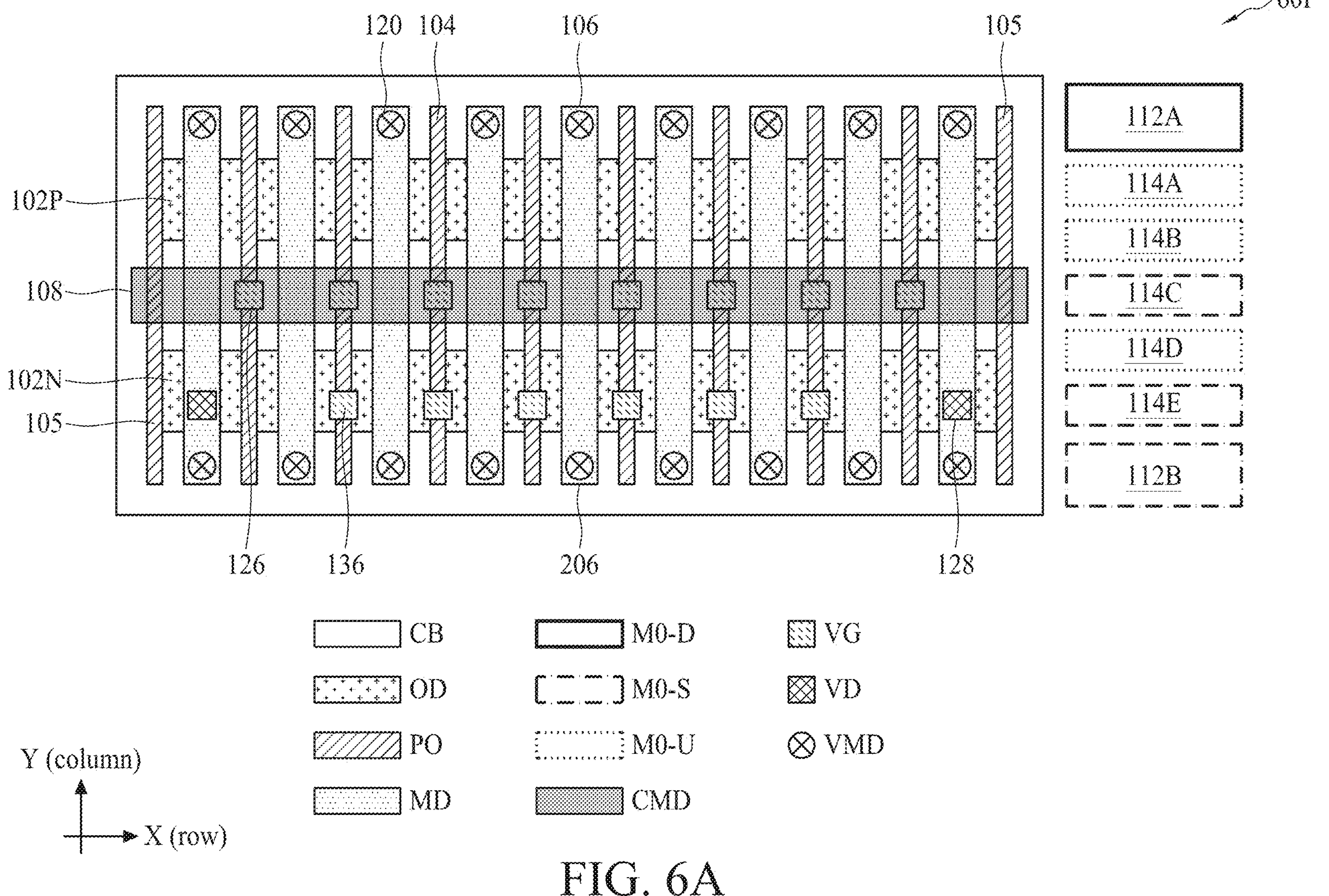
FIGS. 6A and 6B are schematic block diagrams of cells, in accordance with various embodiments of the present disclosure.

FIG. 6A is a schematic block diagram of a cell 60P, in accordance with some embodiments of the present disclosure. The cell 60P is similar to the cell 40P shown in FIG. 4A in many aspects, and thus these similar features will not be repeated herein for brevity. Referring to FIG. 4A and FIG. 6A, the cell 60P differs from the cell 40P mainly in that all of the drain vias 118 and 128 otherwise electrically coupled to the conductive line 114B or 114E in the cell 40P are removed from the cell 60P. Instead, the first and second gate-layer conductive lines 106 and 206 are electrically coupled to the first and second power rails 122A and 122B, respectively, through the conductive vias 120 (VMD) overlapping the respective first and second power rails 112A and 112B. As a result, a fourth type decoupling capacitance formed between the drain vias 118, 128 and the gate electrodes 104 that would otherwise be present in the cell 40P is now removed from the cell 60P. However, the influence of the reduced TDDB effect is much more than the influence of the decreased decoupling capacitance. Therefore, the risk of potential TDDB on the IMD layer between the drain vias 118, 128 and the gate electrodes 104 is relieved with negligible performance loss.

Figure 6B:
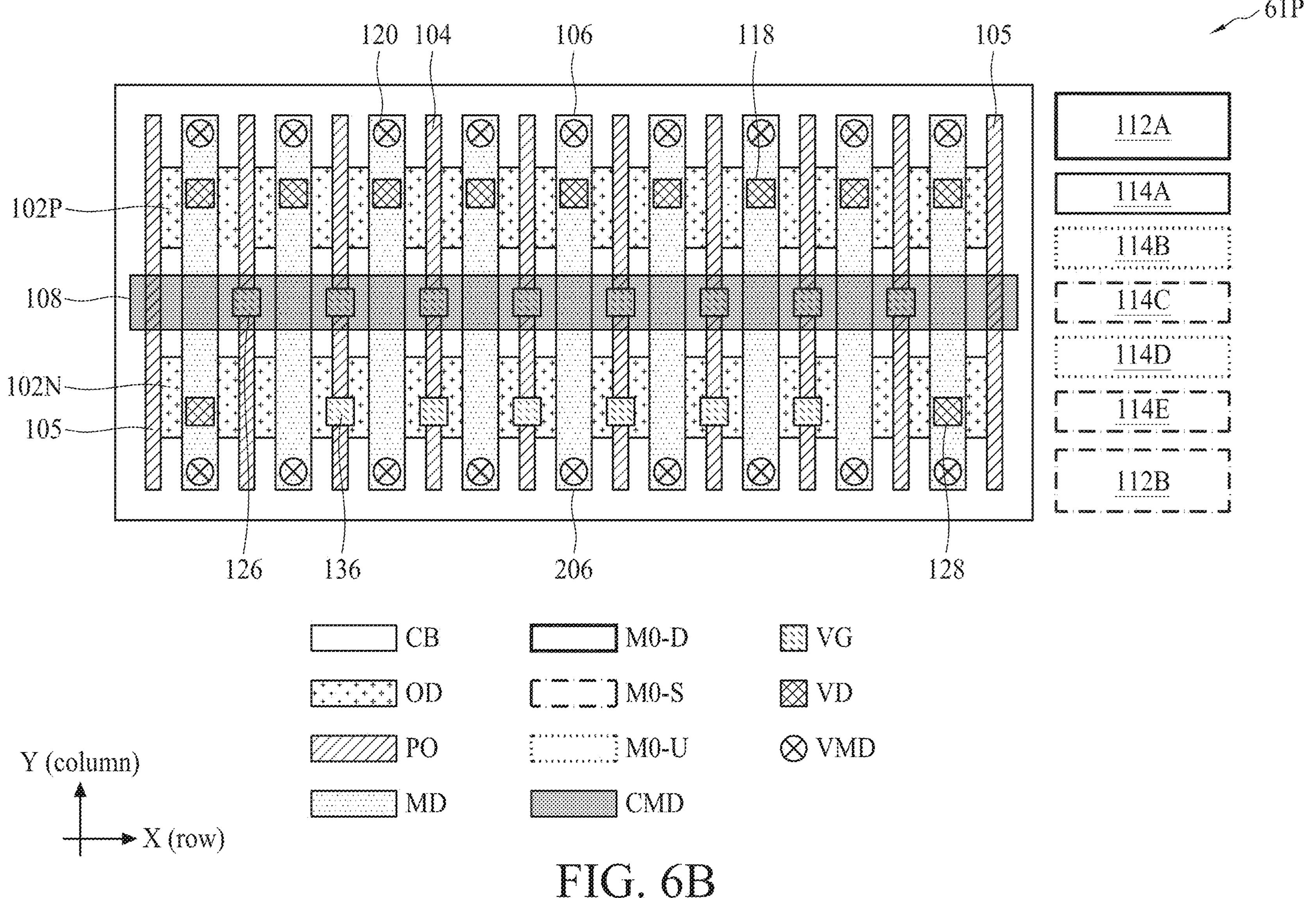

FIG. 6B is a schematic block diagram of a cell 61P, in accordance with some embodiments of the present disclosure. The cell 61P is similar to the cell 40P shown in FIG. 4A in many aspects, and thus these similar features will not be repeated herein for brevity. Referring to FIG. 4A and FIG. 6B, the cell 61P differs from the cell 40P mainly in that the drain vias 118 otherwise electrically coupled to the conductive line 114B in the cell 40P are instead electrically coupled to the conductive line 114A in the cell 60P. The conductive line 114B is now configured as electrically floating. As a result, a third type decoupling capacitance formed between the conductive lines 114B and 114C that would otherwise be present in the cell 40P is now removed or decreased in the cell 60P. The risk of potential TDDB on the IMD layer between the conductive lines 114B and 114C is relieved with negligible performance loss.

Figure 7A:
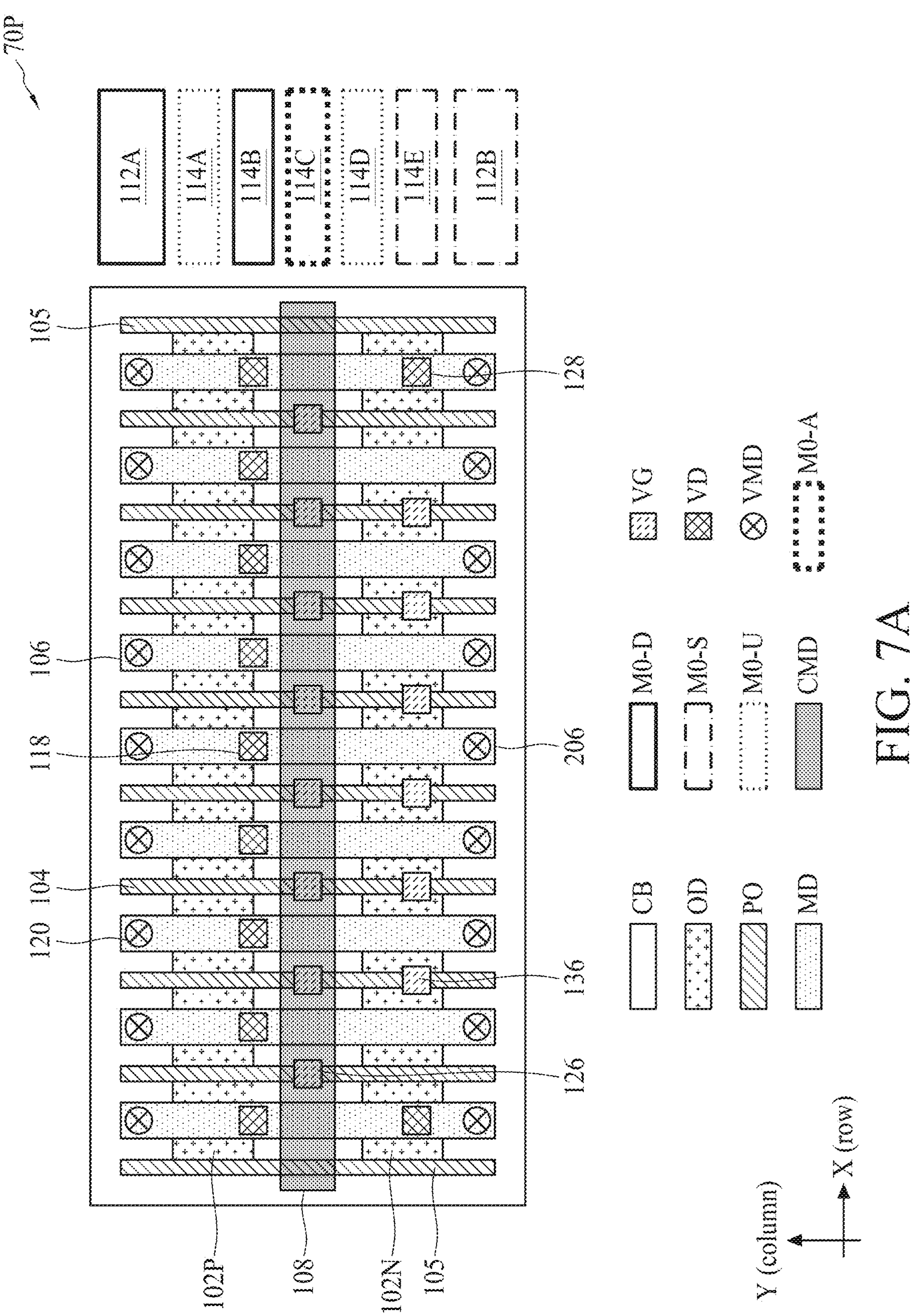
FIGS. 7A and 7B are schematic block diagrams of cells, in accordance with various embodiments of the present disclosure.

FIG. 7A is a schematic block diagram of a cell 70P, in accordance with some embodiments of the present disclosure. The cell 70P is similar to the cell 40P shown in FIG. 4A in many aspects, and thus these similar features will not be repeated herein for brevity. Referring to FIG. 4A and FIG. 7A, the cell 70P differs from the cell 40P mainly in that the cell 70P is required to receive a signal source at some terminals, e.g., the gate terminals, through the gate vias 126. In some embodiments, the signal source is a time-varying signal with a voltage waveform representing a sequence of digital data, or the signal source is a clock signal. In contrast, the first supply voltage VDD and the second supply voltage VSS are direct-current (DC) voltages, where both the supply voltages VDD and VSS are power sources with predetermined fixed-valued voltages. In that case, it is preferred to arrange the AC signal source between the first supply voltage VDD and the second supply voltage VSS to reduce the average capacitance/dielectric voltage source between the adjacent conductive lines with opposite supply voltages.

Referring to the cell 70P, the AC signal source to which the gate vias 126 are electrically coupled is arranged on the conductive line 114C between the conductive lines 114B and 114E. In some embodiments, given a conductive line, e.g., the conductive line 114C, receiving an AC signal source, a spacing between that AC conductive line fed with the signal source and another DC conductive line fed with the first supply voltage VDD or the second supply voltage VSS is less than a spacing between two DC conductive lines with the first and second supply voltages VDD/VSS. In some embodiments, the conductive line 114, which receives the AC signal source, is arranged immediately adjacent to another conductive line, e.g., the conductive line 114B, coupled to the first or second supply voltage VDD or VSS to separate the conductive line 114B from other conductive lines coupled to a different supply voltage. Since the voltage level and polarity of the AC signal source changes over time, the resulting second type decoupling capacitance formed between the conductive lines 114B and 114C in the cell 70P would be less than that between the conductive lines 114B and 114C in the cell 40P. Also, the risk of potential TDDB on the IMD layer between the conductive lines 114B and 114C is decreased with negligible performance loss.

Figure 7B:
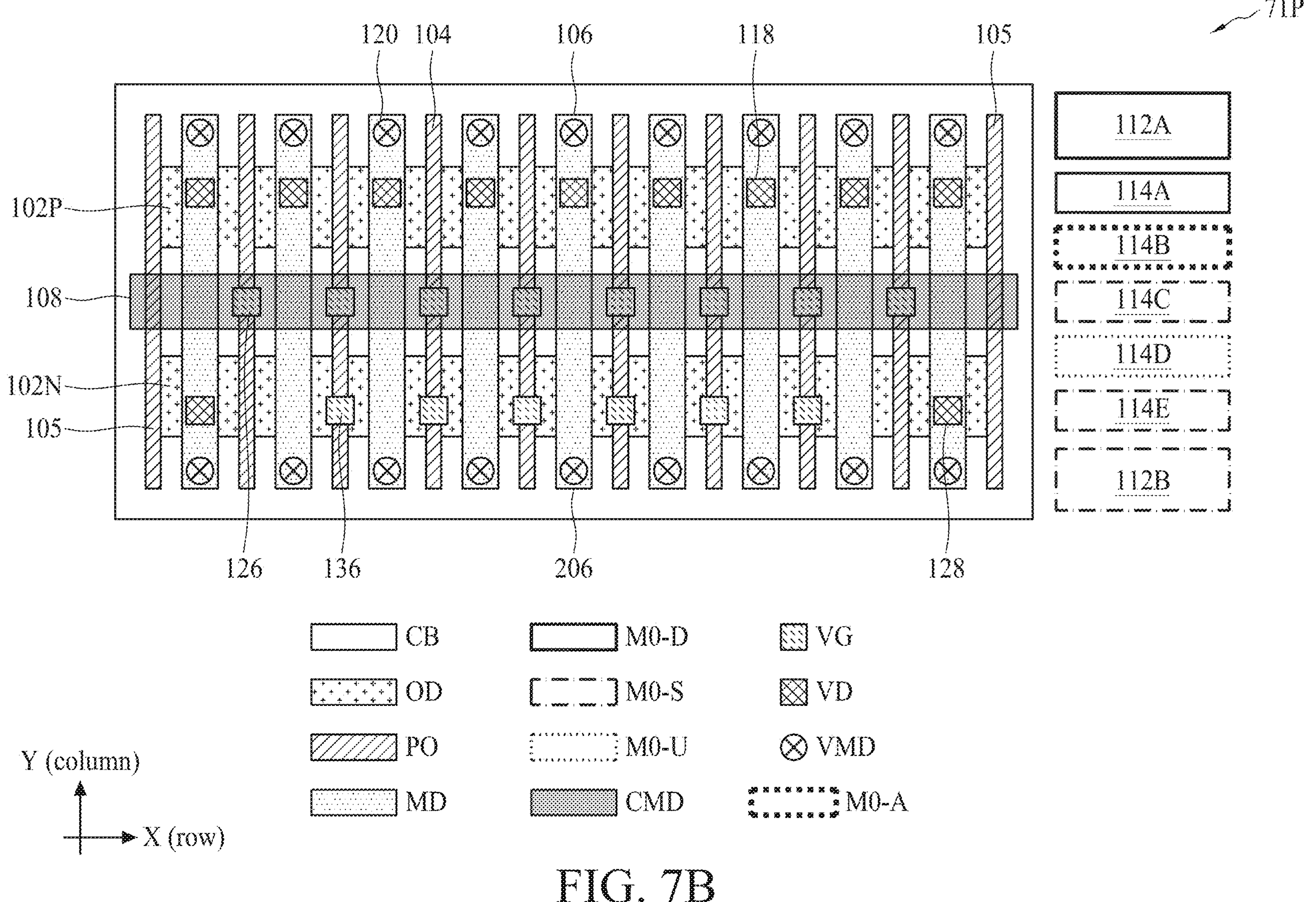

FIG. 7B is a schematic block diagram of a cell 71P, in accordance with some embodiments of the present disclosure. The cell 71P is similar to the cell 40P shown in FIG. 4A in many aspects, and thus these similar features will not be repeated herein for brevity. Referring to FIG. 4A and FIG. 7B, the cell 71P differs from the cell 40P mainly in that the drain vias 118 otherwise electrically coupled to the conductive line 114B in the cell 40P are electrically coupled to the conductive line 114A in the cell 71P, which is now electrically coupled to the first supply voltage VDD. Further, the conductive line 114B is configured to receive an AC signal source, which has a waveform with an AC voltage. In that case, the conductive line 114B is arranged between the conductive lines 114A electrically coupled to the first supply voltage VDD and the conductive line 114C electrically coupled to the second supply voltage VSS. Since the voltage level and polarity of the signal source changes over time, the resulting second type decoupling capacitance formed between the conductive lines 114B and 114C in the cell 70P would be less than that between the conductive lines 114B and 114C in the cell 40P. Also, the risk of potential TDDB on the IMD layer between the conductive lines 114B and 114C is decreased at the same time. Therefore, the risk of potential TDDB on the IMD layer between the conductive lines 114A and 114C is relieved with negligible performance loss.

Figure 9:
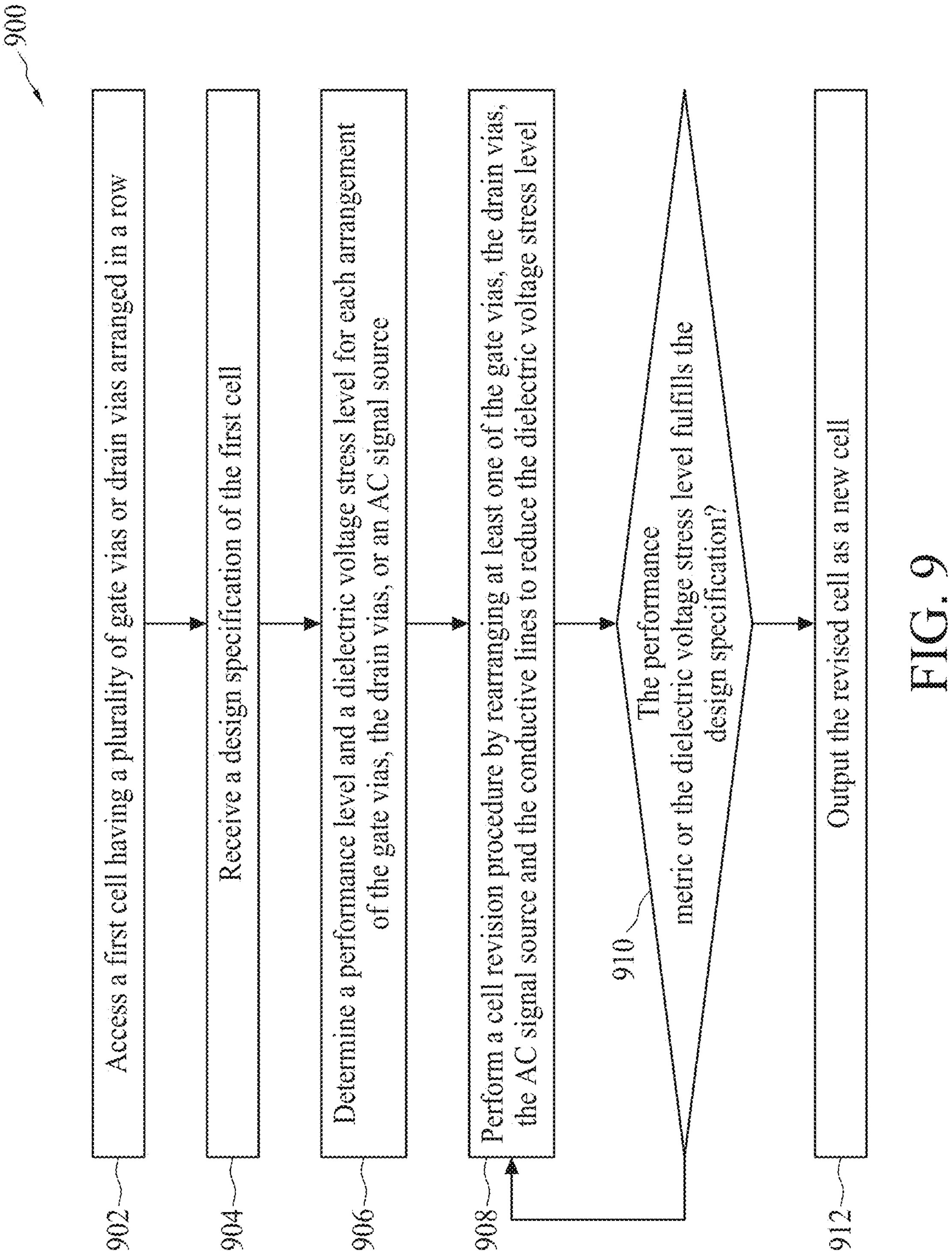
FIG. 9 is a flowchart of a method of generating a cell with reduced dielectric voltage stress, in accordance with some embodiments of the present disclosure.

FIG. 9 is a flowchart of a method 900 of generating or revising a cell with reduced dielectric voltage stress, in accordance with some embodiments of the present disclosure. It shall be understood that additional steps can be provided before, during, and after the steps in method 900, and some of the steps described below can be replaced with other embodiments or eliminated. The order of the steps shown in FIG. 9 may be interchangeable. Some of the steps may be performed concurrently or independently.

At step 902, a first cell is accessed, in which the first cell has a plurality of gate vias or drain vias arranged in a row of the same track. In some embodiments, the number of the gate vias or the drain vias is equal to or greater than three. In some embodiments, the first cell is a decoupling capacitor cell, or any other suitable cell.

At step 904, a design specification of the first cell is received. In some embodiments, the design specification includes a lifetime metric, such as reliability, and a performance metric, such as speed, power, area, and the like, of an electronic circuit fabricated according to the first cell. In some embodiments, the lifetime metric is associated with a dielectric voltage stress level, e.g., a number of occurrences of dielectric voltage stress, in the first cell.

At step 906, a performance level and a dielectric voltage stress level are determined for each arrangement of the gate vias, the drain vias, or a signal source having a time-varying signal with a voltage waveform representing a sequence of digital data, during the design phase of the first cell. The signal source may also be a clock signal. The performance level and the dielectric voltage stress level (e.g., in terms of the number of occurrences of dielectric voltage stress in the first cell) are determined for each combination of the arrangements of the gate vias, the drain vias, and the AC signal source.

At step 908, a cell revision procedure is performed by rearranging at least one of the gate vias, drain vias, the AC signal source and the conductive lines to reduce the dielectric voltage stress level in the first cell. In some embodiments, during the cell revision procedure the locations of the gate vias or drain vias are changed from a one track of the conductive lines to another track to decrease the voltage stress level of an ILD or IMD layer around the gate vias or drain vias. In some embodiments, during the cell revision procedure at least one of the gate vias or drain vias is removed to decrease the voltage stress level of an ILD or IMD layer around the gate vias or drain vias. In some other embodiments, the order of conductive lines to which the gate vias or drain vias are coupled are rearranged in the column direction to decrease the voltage stress level of an ILD or IMD layer between adjacent conductive lines, or decrease the dielectric voltage stress level around the gate vias or drain vias.

At step 910, it is determined whether the performance metric and the dielectric voltage stress level in a revised version of the first cell fulfills the design specification. If it is affirmative, then the method proceeds to step 912, where the revised cell is outputted as a new cell for fabrication or future use. Otherwise, if it is determined that the performance metric or the dielectric voltage stress level in the instant revised version still does not fulfill the design specification, and the method 900 will loop back to step 908 for performing another cell revision until the revised cell fulfills the requirement of the design specification.

Figure 10:
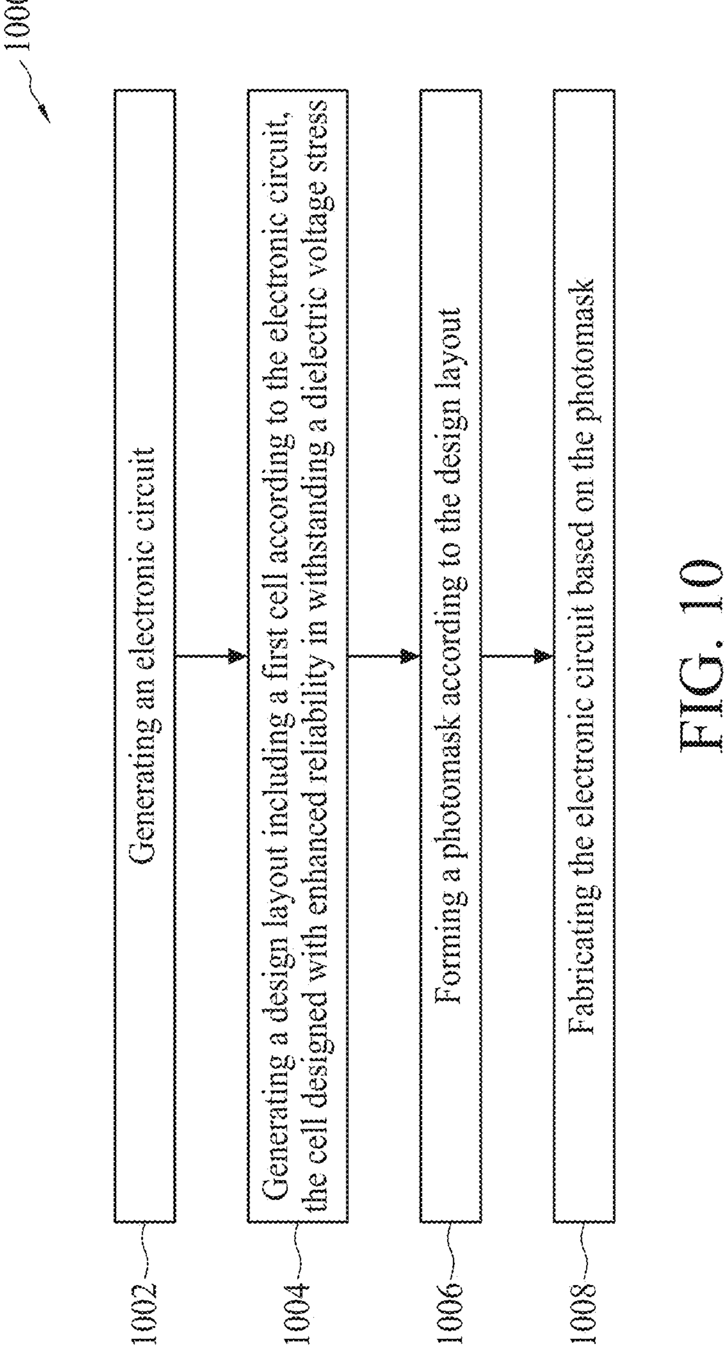
FIG. 10 is a flowchart of a method of forming an electronic circuit, in accordance with some embodiments of the present disclosure.

FIG. 10 is a flowchart of a method 1000 of forming an electronic circuit, in accordance with some embodiments of the present disclosure. It shall be understood that additional steps can be provided before, during, and after the steps in method 1000, and some of the steps described below can be replaced with other embodiments or eliminated. The order of the steps shown in FIG. 10 may be interchangeable. Some of the steps may be performed concurrently or independently.

At step 1002, an electronic circuit is generated. In some embodiments, the electronic circuit is a decoupling capacitor circuit or any other suitable circuit.

At step 1004, a design layout including a first cell is generated according to the electronic circuit, wherein the cell is designed with enhanced reliability in withstanding a dielectric voltage stress. The details of generating the design layout are discussed with reference to previous figures and the method 900.

At step 1006, a photomask is formed according to the design layout. At step 1008, the electronic circuit is fabricated based on the photomask.

In accordance with some embodiments of the present disclosure, a method is provided. The method includes: accessing a first cell, where the first cell includes: a first active region and a second active region extending in a first direction in a first layer; gate electrodes extending in a second direction in a second layer over the first layer; first conductive lines extending in the second direction in the second layer and arranged alternatively with the gate electrodes over the first active region; second conductive lines extending in the second direction in the second layer and arranged alternatively with the gate electrodes over the second active region; a third and a fourth conductive lines extending in the first direction in a third layer over the second layer; and first gate vias arranged in a fourth layer between the second layer and the third layer, wherein the first gate vias overlapping the third conductive line and each of the first gate vias electrically coupled to a corresponding one of the gate electrodes. The method also includes: determining a performance metric and a dielectric voltage stress level; and in response to the performance metric or the dielectric voltage stress level failing to fulfilling a specification, revising the first cell to generate a second cell by moving at least one of the first gate vias to be electrically coupled to the fourth conductive line.

In accordance with some embodiments of the present disclosure, a method is provided. The method includes: generating an electronic circuit; and generating a design layout including a cell according to the electronic circuit. The cell includes: a first active region and a second active region extending in a first direction in a first layer; gate electrodes extending in a second direction in a second layer over the first layer; first conductive lines extending in the second direction in the second layer and arranged alternatively with the gate electrodes over the first active region, the first conductive lines electrically coupled to a first supply voltage; second conductive lines extending in the second direction in the second layer and aligned with the respective first conductive lines over the second active region, the second conductive lines electrically coupled to a second supply voltage; a third conductive line extending in the first direction in a third layer over the second layer, the third conductive line overlapping the second conductive lines and electrically coupled to the second supply voltage; first gate vias arranged in a fourth layer between the second layer and the third layer, wherein the first gate vias overlap the third conductive line and each of the first gate vias is electrically coupled to a corresponding one of the gate electrodes; and second gate vias arranged in the fourth layer in a space between the first conductive lines and the second conductive lines from a top-view perspective.

In accordance with some embodiments of the present disclosure, a design layout of a cell stored in a non-transitory computer-readable medium is provided. The cell includes: a first active region and a second active region extending in a first direction in a first layer; gate electrodes extending in a second direction in a second layer over the first layer; first conductive lines overlapping the first active region in the second layer and arranged alternatively with the gate electrodes, the first conductive lines electrically coupled to a first supply voltage; second conductive lines overlapping the second active region in the second layer and arranged alternatively with the gate electrodes, the second conductive lines electrically coupled to a second supply voltage; a third conductive line and a fourth conductive line extending in the first direction in a third layer over the second layer and electrically coupled to the second supply voltage; first gate vias arranged in a row in a fourth layer between the second layer and the third layer and electrically coupled to the third conductive line, wherein the first gate vias are electrically coupled to the gate electrodes; and second gate vias arranged in a row in the fourth layer and electrically coupled to the fourth conductive line.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

accessing a first cell, the first cell including:

a first active region and a second active region extending in a first direction in a first layer;

gate electrodes extending in a second direction in a second layer over the first layer;

first conductive lines extending in the second direction in the second layer and arranged alternatively with the gate electrodes over the first active region;

second conductive lines extending in the second direction in the second layer and arranged alternatively with the gate electrodes over the second active region;

a third and a fourth conductive lines extending in the first direction in a third layer over the second layer, wherein the third conductive line is overlapped with the first active region and the fourth conductive line is non-overlapped with the first active region, respectively; and first gate vias arranged in a fourth layer between the second layer and the third layer, wherein the first gate vias overlapping the third conductive line and each of the first gate vias electrically coupled to a corresponding one of the gate electrodes;

determining a performance metric and a dielectric voltage stress level; and in response to the performance metric or the dielectric voltage stress level failing to fulfilling a specification, revising the first cell to generate a second cell by moving at least one of the first gate vias to be electrically coupled to the fourth conductive line.

2. The method of claim 1, wherein the first cell further comprises a first power rail and a second power rail extending in the first direction in the third layer, wherein the first conductive lines are electrically coupled to the first power rail, and the second conductive lines are electrically coupled to the second power rail.

3. The method of claim 2, wherein the first power rail is coupled to a first supply voltage, and the second power rail is electrically coupled to a second supply voltage.

4. The method of claim 2, wherein the generating of the second cell further comprises:

arranging a fifth conductive line extending in the first direction in the third layer and parallel to the third and fourth conductive lines, wherein a distance between the first power rail and the fifth conductive line measured in the second direction is less than a distance between the second power rail and the fifth conductive line measured in the second direction; and arranging at least one drain via in the fourth layer and electrically coupled to the fifth conductive line.

5. The method of claim 4, wherein the generating of the second cell comprises arranging only one drain via to couple to the fifth conductive line, wherein the only one drain via and the first conductive lines are coupled to a same voltage level.

6. The method of claim 4, wherein the generating of the second cell further comprises:

arranging a sixth conductive line extending in the first direction in the third layer and parallel to the third and fourth conductive lines, wherein a distance between the first power rail and the sixth conductive line measured in the second direction is less than a distance between the second power rail and the sixth conductive line measured in the second direction; and arranging a second gate via in the fourth layer and electrically coupled to the sixth conductive line.

7. The method of claim 6, wherein the second gate via is between the first power rail and the at least one drain via.

8. The method of claim 1, wherein the generating of the second cell further comprises:

arranging a seventh conductive line extending in the first direction in the third layer and parallel to the third and fourth conductive lines, wherein the seventh conductive line is between the first active region and the second active region from a top-view perspective; and arranging third gate vias in the fourth layer and electrically coupling the seventh conductive line to a corresponding one of the gate electrodes.

9. The method of claim 8, wherein the seventh conductive line is coupled to ground.

10. The method of claim 1, wherein the first active region is a P-type active region, and the second active region is an N-type active region.

11. A method, comprising:

accessing a cell according to an electronic circuit, the cell comprising:

a first active region and a second active region extending in a first direction in a first layer;

gate electrodes extending in a second direction in a second layer over the first layer;

first conductive lines extending in the second direction in the second layer and arranged alternatively with the gate electrodes over the first active region, the first conductive lines electrically coupled to a first supply voltage; and second conductive lines extending in the second direction in the second layer and aligned with the respective first conductive lines over the second active region, the second conductive lines electrically coupled to a second supply voltage; and in an attempt to meet a specification of performance metrics, arranging the cell by:

arranging a third conductive line extending in the first direction in a third layer over the second layer, the third conductive line overlapping the second conductive lines and electrically coupled to the second supply voltage;

arranging first gate vias in a fourth layer between the second layer and the third layer, wherein the first gate vias overlap the third conductive line and each of the first gate vias is electrically coupled to a corresponding one of the gate electrodes; and arranging second gate vias in the fourth layer in a space between the first conductive lines and the second conductive lines from a top-view perspective.

12. The method of claim 11, wherein the first supply voltage is a positive voltage, and the second supply voltage is substantially zero volts or a negative voltage.

13. The method of claim 11, wherein the arranging of the cell further comprises:

arranging a fourth conductive line extending in the first direction in the third layer, wherein a distance between a first power rail and the fourth conductive line measured in the second direction is less than a distance between a second power rail and the fourth conductive line measured in the second direction; and arranging a first drain via on the fourth conductive line and overlapped with the fourth conductive line, the fourth conductive line being free from any other drain via coupled thereto.

14. The method of claim 13, wherein the arranging of the cell further comprises:

arranging a fifth conductive line extending in the first direction in the third layer and parallel to the fourth conductive line, wherein the fifth conductive line is coupled to the first supply voltage and the second gate vias are electrically coupled to the second supply voltage.

15. The method of claim 14, wherein the arranging of the cell further comprises forming a first opening in the fifth conductive line, the first opening aligned with the first drain via in the second direction.

16. The method of claim 15, wherein the cell further comprises:

a sixth conductive line extending in the first direction in the third layer on a side of the fourth conductive line opposite to the fifth conductive line, wherein the method further comprising forming a second opening disposed in the sixth conductive line and aligned with the first drain via in the second direction.

17. A method, comprising:

accessing a first cell, the first cell including:

a first active region and a second active region extending in a first direction in a first layer;

gate electrodes extending in a second direction in a second layer over the first layer;

first conductive lines extending in the second direction in the second layer and arranged alternatively with the gate electrodes over the first active region;

second conductive lines extending in the second direction in the second layer and arranged alternatively with the gate electrodes over the second active region;

a third and a fourth conductive lines extending in the first direction in a third layer over the second layer, wherein the third conductive line is overlapped with the first active region; and first gate vias arranged in a fourth layer between the second layer and the third layer, wherein the first gate vias overlapping the third conductive line and each of the first gate vias electrically coupled to a corresponding one of the gate electrodes;

determining a performance metric and a dielectric voltage stress level; and in response to the performance metric or the dielectric voltage stress level failing to fulfilling a specification, revising the first cell to generate a second cell by:

arranging the first gate vias to be coupled to the fourth conductive line in a space between the first conductive lines and the second conductive lines.

18. The method of claim 17, wherein the generating of the second cell further comprises:

arranging a first power rail and a second power rail on an upper side and a lower side, respectively, of the cell in the third layer and configured to supply a first supply voltage and a second supply voltage, respectively; and arranging a fifth conductive line extending in the first direction in the third layer and immediately adjacent to the fourth conductive line, wherein the first and second supply voltages are fixed-valued voltages, and the fourth conductive line is configured to receive a time-varying signal representing a sequence of digital data.

19. The method of claim 17, wherein the generating of the second cell further comprises:

arranging a sixth conductive line extending in the first direction in the third layer and overlapping the first active region; and arranging a second gate via electrically coupled to the sixth conductive line, wherein the sixth conductive line is free from any other gate via coupled thereto.

20. The method of claim 17, wherein the generating of the second cell further comprises:

arranging a drain via on a seven conductive line extending in the first direction in the third layer; and causing an eight conductive line immediately adjacent to the seven conductive line to be electrically floating or removed from the second cell.

* * * * *